US012193283B2

(12) United States Patent
You et al.

(10) Patent No.: US 12,193,283 B2
(45) Date of Patent: Jan. 7, 2025

(54) DISPLAY DEVICE INCLUDING PAD AREA

(71) Applicant: Samsung Display Co., Ltd., Yongin-Si (KR)

(72) Inventors: Chungi You, Asan-si (KR); Younggug Seol, Cheonan-si (KR); Kijong Eom, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 527 days.

(21) Appl. No.: 17/528,584

(22) Filed: Nov. 17, 2021

(65) Prior Publication Data

US 2022/0157918 A1    May 19, 2022

(30) Foreign Application Priority Data

Nov. 19, 2020   (KR) .................. 10-2020-0155480
Jul. 5, 2021     (KR) .................. 10-2021-0087834

(51) Int. Cl.
 *H10K 59/131*   (2023.01)
 *H10K 59/88*    (2023.01)
 *H10K 71/00*    (2023.01)
 *H10K 59/12*    (2023.01)

(52) U.S. Cl.
 CPC .......... *H10K 59/131* (2023.02); *H10K 59/88* (2023.02); *H10K 71/00* (2023.02); *H10K 59/1201* (2023.02)

(58) Field of Classification Search
 CPC ...... H10K 59/131; H10K 59/88; H10K 71/00; H10K 59/1201; H10K 59/123; H10K 59/1213; H01L 27/124
 See application file for complete search history.

(56) References Cited

U.S. PATENT DOCUMENTS

2006/0238689 A1* 10/2006 Kim .................. G02F 1/136227
                                                                430/317
2018/0308903 A1* 10/2018 Jeong .................... G06F 3/0418

FOREIGN PATENT DOCUMENTS

| KR | 1020060093573 A | 8/2006 |
| KR | 100985793 B1 | 10/2010 |
| KR | 101084169 B1 | 11/2011 |
| KR | 1020200076938 A | 6/2020 |

* cited by examiner

*Primary Examiner* — Kyoung Lee
(74) *Attorney, Agent, or Firm* — CANTOR COLBURN LLP

(57) ABSTRACT

A display device includes a substrate including a pad region, a first conductive pattern disposed on the pad region of the substrate and having a quadrangle shape in a plan view, an insulating layer disposed on the substrate and covering the first conductive pattern, and a second conductive pattern disposed on the insulating layer and contacting the first conductive pattern through a plurality of contact holes defined in the insulating layer. The plurality of the contact holes are arranged along a diagonal direction of the quadrangle shape in the plan view.

23 Claims, 16 Drawing Sheets

DISPLAY DEVICE INCLUDING PAD AREA

This application claims priority to Korean Patent Application No. 10-2021-0087834, filed on Jul. 5, 2021, and Korean Patent Application No. 10-2020-0155480, filed on Nov. 19, 2020, and all the benefits accruing therefrom under 35 U.S.C. § 119, the contents of which in their entirety are herein incorporated by reference.

BACKGROUND

Field

Implementations of the invention relate generally to a display device. More particularly, implementations of the invention relate to the display device including a plurality of pads.

Discussion of the Background

A display device includes a plurality of pixels and a plurality of pads. The pads are bonded to a circuit board (e.g., a driving chip or a flexible printed circuit board), and transmit signals and/or voltages to the pixels. As an adhesive (e.g., an anisotropic conductive film ("ACF")) is applied to the pads and pressure is applied to the pads and the circuit board, the pads may be bonded to the circuit board. In order to check whether the pads are normally bonded to the circuit board, an indentation inspection process and a rework process are performed. The indentation inspection process is a process of inspecting a position of the pressure and a magnitude of the pressure. The rework process is a process of removing the circuit board and cleaning the pads.

SUMMARY

While the rework process is performed, shapes of the pads may be deformed. For example, conductive patterns included in the pads may be pushed. As the pushed conductive patterns contact the adjacent pads, a short defect may occur between the pads.

Embodiments provide a display device including a plurality of pads.

A display device according to an embodiment includes a substrate including a pad region, a first conductive pattern disposed on the pad region of the substrate and having a quadrangle shape in a plan view, an insulating layer disposed on the substrate and covering the first conductive pattern, and a second conductive pattern disposed on the insulating layer and contacting the first conductive pattern through a plurality of contact holes defined in the insulating layer. The plurality of the contact holes is arranged along a diagonal direction of the quadrangle shape in the plan view.

According to an embodiment, the quadrangle shape may include a first side extending in a first direction and a second side extending in a second direction perpendicular to the first direction, and the diagonal direction may be between the first direction and the second direction.

According to an embodiment, a length of the first side may be less than a length of the second side.

According to an embodiment, a length of the first side may be at least three times greater than a length of each of the contact holes in the first direction.

According to an embodiment, the insulating layer may include an overlapping portion surrounding each of the contact holes and overlapping the first conductive pattern in the plan view and a non-overlapping portion surrounding the overlapping portion and which does not overlap the first conductive pattern in the plan view, and having a top which is disposed lower than a top of the overlapping portion.

According to an embodiment, a thickness of the overlapping portion may be the same as a thickness of the non-overlapping portion.

According to an embodiment, each of a thickness of the overlapping portion and a thickness of the non-overlapping portion may be about 6000 angstroms (Å) to about 7000 angstroms.

According to an embodiment, the display device may further include a third conductive pattern disposed on the second conductive pattern and directly contacting the second conductive pattern.

According to an embodiment, a material included in the second conductive pattern may be the same as a material included in the third conductive pattern.

According to an embodiment, the second conductive pattern and the third conductive pattern may each have a Ti/Al/Ti structure.

According to an embodiment, the material included in the second conductive pattern may be different from a material included in the first conductive pattern.

According to an embodiment, the first conductive pattern may include molybdenum.

According to an embodiment, the substrate may further include a display region adjacent to the pad region. The display device may further include an active pattern disposed on the substrate and overlapping the display region in the plan view, a gate electrode disposed in the same layer as the first conductive pattern and overlapping the active pattern in the plan view, a first connection electrode disposed in the same layer as the second conductive pattern and contacting the active pattern, a second connection electrode disposed in the same layer as the third conductive pattern and contacting the first connection electrode, a first electrode disposed on the second connection electrode and contacting the second connection electrode, an emission layer disposed on the first electrode, and a second electrode disposed on the emission layer.

According to an embodiment, the display device may further include a fourth conductive pattern disposed on the third conductive pattern and directly contacting the third conductive pattern.

According to an embodiment, the display device may further include a first dummy pattern disposed on the substrate, overlapping the pad region, and spaced apart from the first conductive pattern in the plan view and a second dummy pattern disposed on the first dummy pattern and contacting the first dummy pattern through a dummy contact hole defined in the insulating layer.

According to an embodiment, an area of the dummy contact hole may be different from an area of each of the plurality of the contact holes in the plan view.

According to an embodiment, the area of the dummy contact hole may be larger than the area of each of the plurality of the contact holes.

According to an embodiment, the pad region may include a central region and an outer region adjacent to the central region in the plan view. The first conductive pattern may be disposed in the central region and the first dummy pattern may be disposed in the outer region.

According to an embodiment, the first dummy pattern and the second dummy pattern may each be electrically floated.

A display device according to another embodiment includes a substrate including a pad region, a first conductive pattern disposed on the pad region of the substrate and having a quadrangle shape in a plan view, an insulating layer disposed on the substrate and covering the first conductive pattern, and a second conductive pattern disposed on the insulating layer and contacting the first conductive pattern through a plurality of contact holes defined in the insulating layer. The plurality of the contact holes includes a first contact hole, a second contact hole, and a third contact hole which are spaced apart from each other, the first contact hole and the second contact hole are arranged along a first diagonal direction of the quadrangle shape, and the second contact hole and the third contact hole are arranged along a second diagonal direction intersecting the first diagonal direction.

According to an embodiment, the quadrangle shape may include a first side extending in a first direction and a second side extending in a second direction perpendicular to the first direction, the first diagonal direction may be a direction between the first direction and the second direction, and the second diagonal direction may be a direction between a third direction and the second direction, and the third direction is opposite to the first direction.

A display device according to still another embodiment includes a substrate including a pad region, a first conductive pattern on the pad region of the substrate, a first dummy pattern disposed in the same layer as the first conductive pattern and spaced apart from the first conductive pattern, an insulating layer disposed on the substrate and covering the first conductive pattern and the first dummy pattern, a second conductive pattern disposed on the insulating layer and contacting the first conductive pattern through a plurality of contact holes defined in the insulating layer, and a second dummy pattern disposed on the insulating layer and contacting the first dummy pattern through a dummy contact hole. The dummy contact hole is defined in the insulating layer and has an area different from an area of each of the plurality of the contact holes.

According to an embodiment, the area of the dummy contact hole may be larger than the area of each of the plurality of the contact holes.

According to an embodiment, the first conductive pattern may have a quadrangle shape and the plurality of the contact holes may be arranged along a diagonal direction of the quadrangle shape in a plan view.

Therefore, the display device according to embodiments may include the plurality of pads. Each of the pads may include the first conductive pattern and the second conductive pattern contacting the first conductive pattern through the contact holes. The length (or area) of each of the contact holes may be set significantly smaller than the length (or area) of the first conductive pattern. In other words, the second conductive pattern may contact the first conductive pattern with a point. Accordingly, the width of the step difference due to the contact holes generated on the upper surface of the second conductive pattern may be minimized. Accordingly, while the rework process is performed, the shapes of the pads may not be deformed, and a short defect between the pads may be effectively prevented.

In addition, the contact holes may be arranged along the diagonal direction. Accordingly, the indentation inspection process may be easily performed. In other words, as the contact holes are arranged along the diagonal direction, the pressure applied to the terminals, the conductive balls, and the pads may be easily inspected.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Illustrative, non-limiting embodiments will be more clearly understood from the following detailed description in conjunction with the accompanying drawings.

Figure 1:
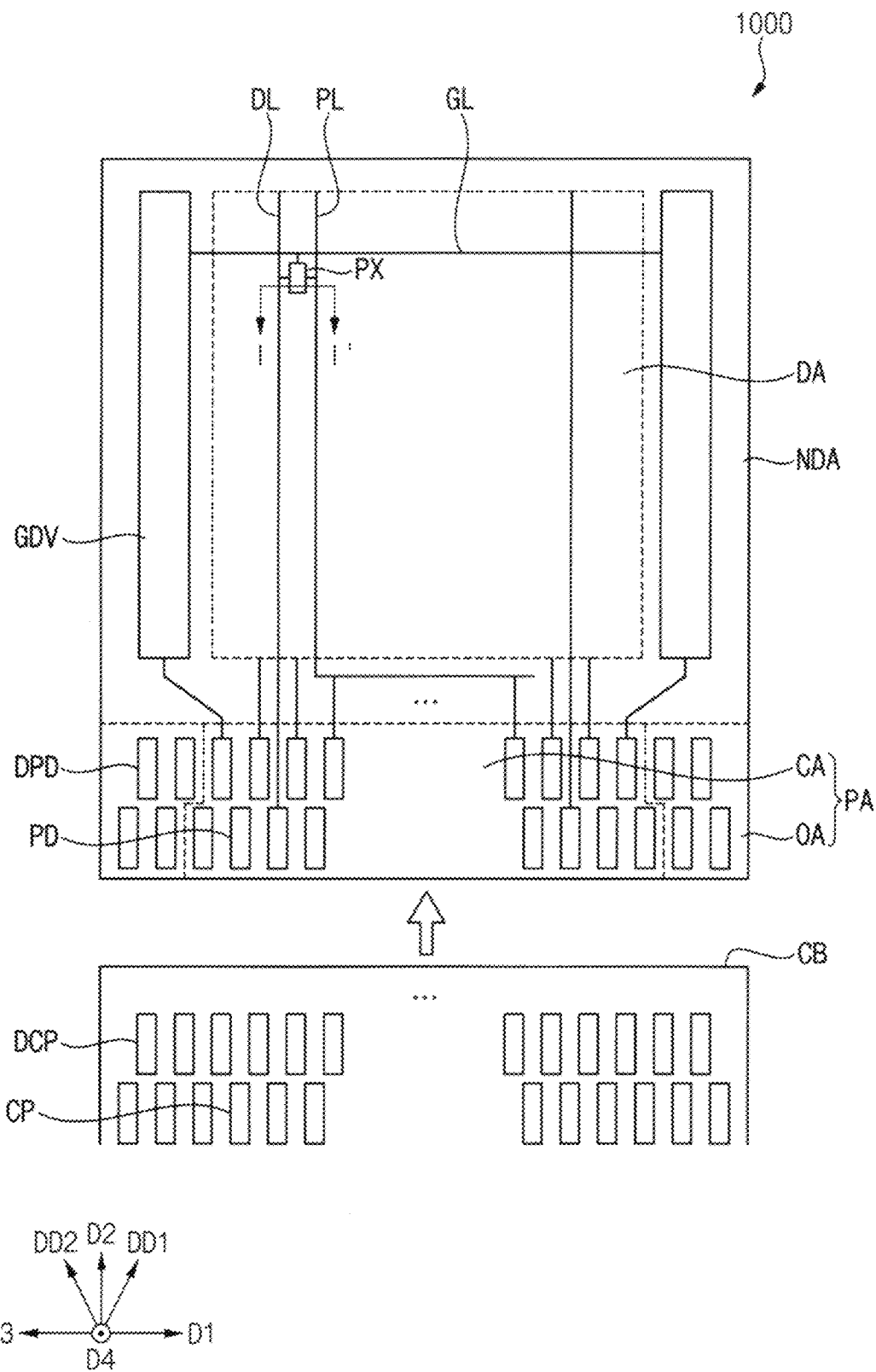
FIG. 1 is a plan view illustrating a display device according to an embodiment.
Figure 2:
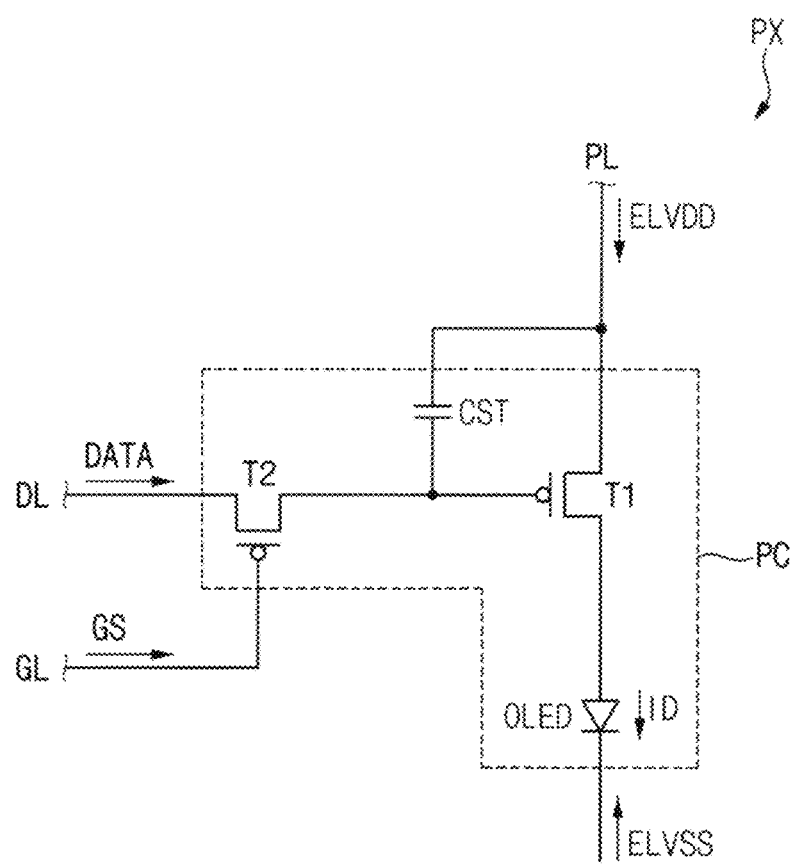
FIG. 2 is a circuit diagram illustrating a pixel included in the display device of FIG. 1.

FIG. 1 is a plan view illustrating a display device according to an embodiment. FIG. 2 is a circuit diagram illustrating a pixel included in the display device of FIG. 1.

Referring to FIG. 1, a display device 1000 according to an embodiment may be partitioned into a display region DA, a non-display region NDA, and a pad region PA. For example, the display region DA may have a quadrangle shape, the non-display region NDA may be positioned to surround the display region DA, and the pad region PA may be disposed adjacent to the non-display region NDA at one end thereof.

A pixel PX, a gate line GL, a data line DL, and a driving voltage line PL may be disposed in the display region DA of the display device 1000. For example, the gate line GL may extend in a first direction D1 and may transmit a gate signal GS to the pixel PX. The data line DL may extend in a second direction D2 perpendicular to the first direction D1 and may provide a data voltage DATA to the pixel PX. The driving voltage line PL may extend in the second direction D2 and may provide a driving voltage ELVDD to the pixel PX. The data voltage DATA may be written to the pixel PX in response to the gate signal GS. The pixel PX may emit light having a luminance based on the data voltage DATA. As the pixel PX emits light, an image may be displayed in the display region DA.

A gate driver GDV and a common voltage line may be disposed in the non-display region NDA of the display device 1000. The gate driver GDV may be connected to the gate line GL and pads PD. The gate driver GDV may receive a gate control signal, a clock signal, etc. from the pads PD, and may generate the gate signal GS. The common voltage line may be connected to the pads PD and a second electrode (e.g., a second electrode CTE of FIG. 4). The common voltage line may transmit a common voltage ELVSS from the pads PD to the second electrode CTE.

Referring to FIG. 2, a pixel circuit PC may include a first transistor T1, a second transistor T2, a storage capacitor CST, and an organic light emitting diode OLED.

The first transistor T1 may include a first terminal, a second terminal, and a gate terminal. The first terminal of the first transistor T1 may receive the driving voltage ELVDD, the second terminal of the first transistor T1 may be connected to the organic light emitting diode OLED, and the gate terminal of the first transistor T1 may be connected to the second transistor T2. The first transistor T1 may generate a driving current ID based on the data voltage DATA.

The second transistor T2 may include a first terminal, a second terminal, and a gate terminal. The first terminal of the second transistor T2 may receive the data voltage DATA, the second terminal of the second transistor T2 may be connected to the first transistor T1, and the gate terminal of the second transistor T2 may receive the gate signal GS. The second transistor T2 may transmit the data voltage DATA in response to the gate signal GS.

The storage capacitor CST may include a first terminal and a second terminal. The first terminal of the storage capacitor CST may receive the driving voltage ELVDD, and the second terminal of the storage capacitor CST may be connected to the gate terminal of the first transistor T1. The data voltage DATA may be stored in the storage capacitor CST.

The organic light emitting diode OLED may include a first terminal and a second terminal. The first terminal of the organic light emitting diode OLED may be connected to the first transistor T1, and the second terminal of the organic light emitting diode OLED may receive the common voltage ELVSS. The organic light emitting diode OLED may generate light based on the driving current ID.

However, a connection structure of the pixel circuit PC according to the invention may not be limited to the above-described connection structure. In another embodiment, the pixel circuit PC may further include at least one more transistor. For example, the pixel circuit PC may have a 3T1C structure (e.g., a structure having three transistors and one capacitor), a 7T2C structure (e.g., a structure having seven transistors and two capacitors), or the like.

Referring back to FIG. 1, a plurality of pads PD and a plurality of dummy pads DPD may be disposed in the pad region PA of the display device 1000. For example, the pads PD may be arranged along the first direction D1 and may be spaced apart from each other in the second direction D2. The dummy pads DPD may be arranged along the first direction D1 and may be spaced apart from each other in the second direction D2.

In addition, the pad region PA may include a central region CA and an outer region OA. The central region CA may correspond to a central portion of the display device 1000. The outer region OA may correspond to left and right portions of the display device 1000 as shown FIG. 1, and may be adjacent to the center region CA. For example, the vertical broken lines in the pad region PA are the border line between the central region CA and the outer region OA. The pads PD may overlap the central region CA, and the dummy pads DPD may overlap the outer region OA in a plan view.

However, an arrangement structure of the pads PD and the dummy pads DPD according to the invention is not limited thereto.

In an embodiment, the pads PD may transmit signals (e.g., voltages) from an external device to the display device 1000. For example, the pads PD may include a first pad, a second pad, a third pad, and a fourth pad. The first pad may be electrically connected to the gate driver GDV, the second pad may be electrically connected to the data line DL, the third pad may be electrically connected to the driving voltage line PL, and the fourth pad may be electrically connected to the common voltage line. However, a connection structure of the pads PD according to the invention is not limited thereto.

The dummy pads DPD may be electrically insulated from any component included in the display device 1000. In other words, the dummy pads DPD may be electrically floating.

In an embodiment, the pads PD may have substantially the same stack structure with each other. For example, each of the pads PD may have a structure in which a plurality of conductive patterns are stacked. In addition, the pads PD may be formed together with the pixel PX.

In an embodiment, the dummy pads DPD may have substantially the same stack structure with each other. For example, each of the dummy pads DPD may have a structure in which a plurality of dummy patterns are stacked. In addition, the dummy pads DPD may be formed together with the pixel PX and the pads PD.

In an embodiment, the pads PD may be electrically connected to a circuit board CB. For example, a data driver, a controller (e.g., a timing controller ("T-CON")), a power management circuit (e.g., "PMIC"), or the like may be disposed on the circuit board CB. The data driver may generate the data voltage DATA. The controller may control the gate driver, the data driver, and the power management circuit. The power management circuit may provide power to drive the display device 1000. In an embodiment, a plurality of terminals CP and a plurality of dummy terminals DCP may be disposed on the circuit board CB. Positions where the terminals CP are disposed may correspond to positions where the pads PD are disposed in a plan view. Positions where the dummy terminals DCP are disposed may correspond to positions where the dummy pads DPD are disposed in a plan view. The circuit board CB may be bonded in the pad region PA so that the terminals CP contact the pads PD physically or electrically. In addition, the circuit board CB may be bonded in the pad region PA so that the dummy terminals DCP contact the dummy pads DPD physically or electrically. For example, through a bonding process, the circuit board CB may be bonded in the pad region PA using an anisotropic conductive film ("ACF"). The anisotropic conductive film may include a plurality of conductive balls, and the conductive balls may be disposed between the pads PD and the terminals CP and may be disposed between the dummy pads DPD and the dummy terminal DCP. As the conductive balls have conductivity, the pads PD and the terminals CP which correspond to each other may be electrically connected to each other.

The dummy pads DPD may prevent the circuit board CB from being deformed during the bonding process. For example, in order to bond the circuit board CB to the pad region PA, a pressure may be applied to the circuit board CB. In this case, the pressure applied to the outer portion of the circuit board CB (e.g., a position where the dummy terminals DCP is formed) may be relatively increased compared to the pressure applied to the center portion of the circuit board CB, and the circuit board CB may be deformed. As the dummy pads DPD support the outer portion of the circuit board CB, the dummy pads DPD may prevent the circuit board CB from being deformed.

The circuit board CB may be a driving chip or a flexible printed circuit board. For example, when the display device 1000 has a chip-on-glass ("COG") structure or a chip-on-plastic ("COP") structure, the circuit board CB may be the driving chip. When the display device 1000 has a chip-on-film ("COF") structure, the circuit board CB may be the flexible printed circuit board. However, the circuit board CB according to the invention is not limited thereto.

After the bonding process, an indentation inspection process and a rework process may be performed. The indentation inspection process may be a process of inspecting the position of the pressure applied in the pad region PA, the level of the pressure, or the like. Pressure applied to the terminals CP, the conductive balls, and the pads PD may be inspected through the indentation inspection process. Accordingly, it may be checked whether the pads PD are normally connected to the terminals CP. The rework process may be a process of removing the circuit board CB and cleaning the pads PD. For example, when the pads PD are abnormally connected to the terminals CP, the circuit board CB may be removed from the pad region PA. In addition, foreign matter (e.g., the conductive balls) remaining on the pads PD may be removed through the rework process.

As the display device 1000 according to embodiments includes the pads PD, a short defect between the pads PD generated during the rework process may be effectively prevented. In addition, as the display device 1000 includes the dummy pads DPD, the indentation inspection process may be more easily performed.

Figure 3:
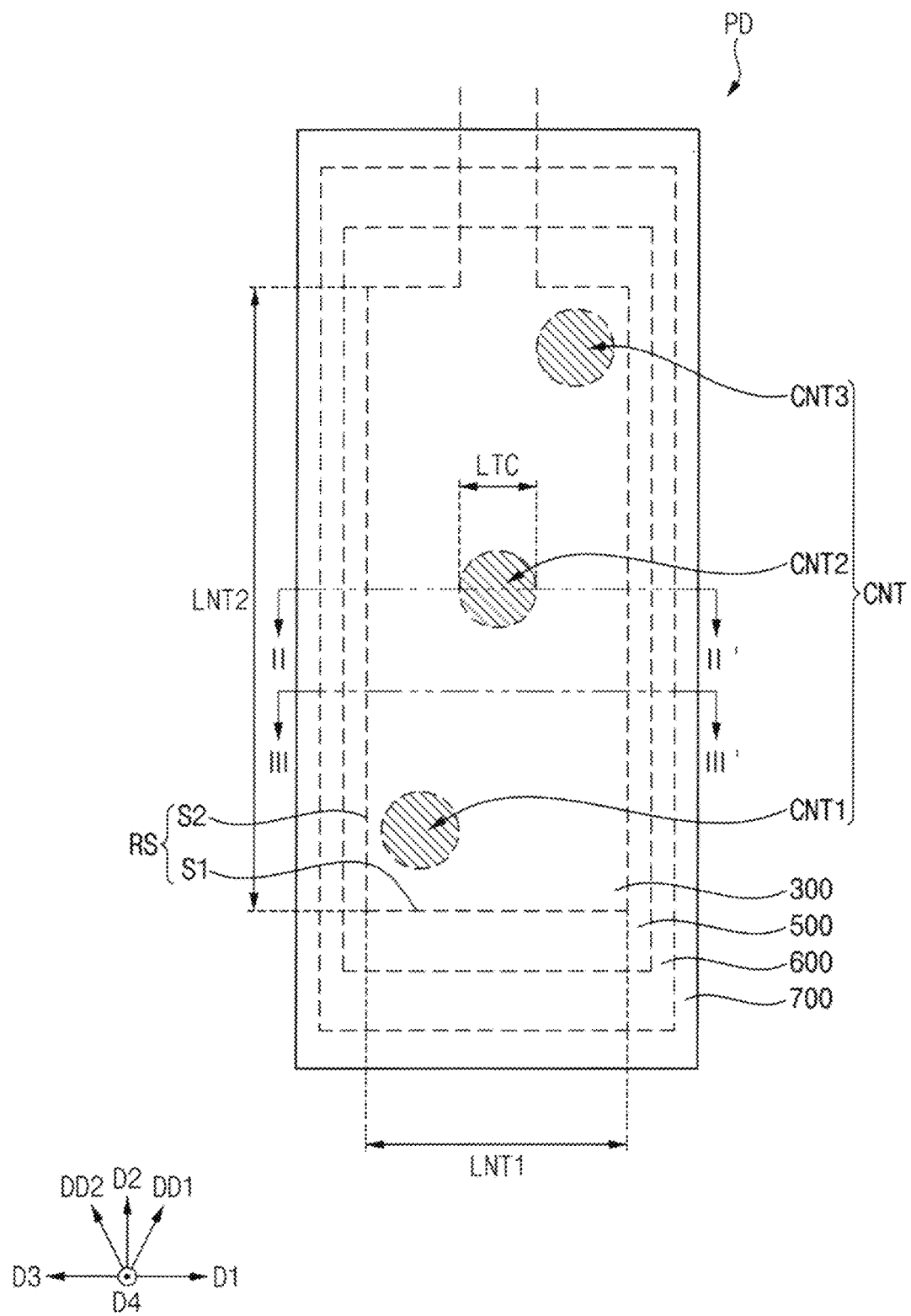
FIG. 3 is a plan view illustrating a pad included in the display device of FIG. 1.
Figure 4:
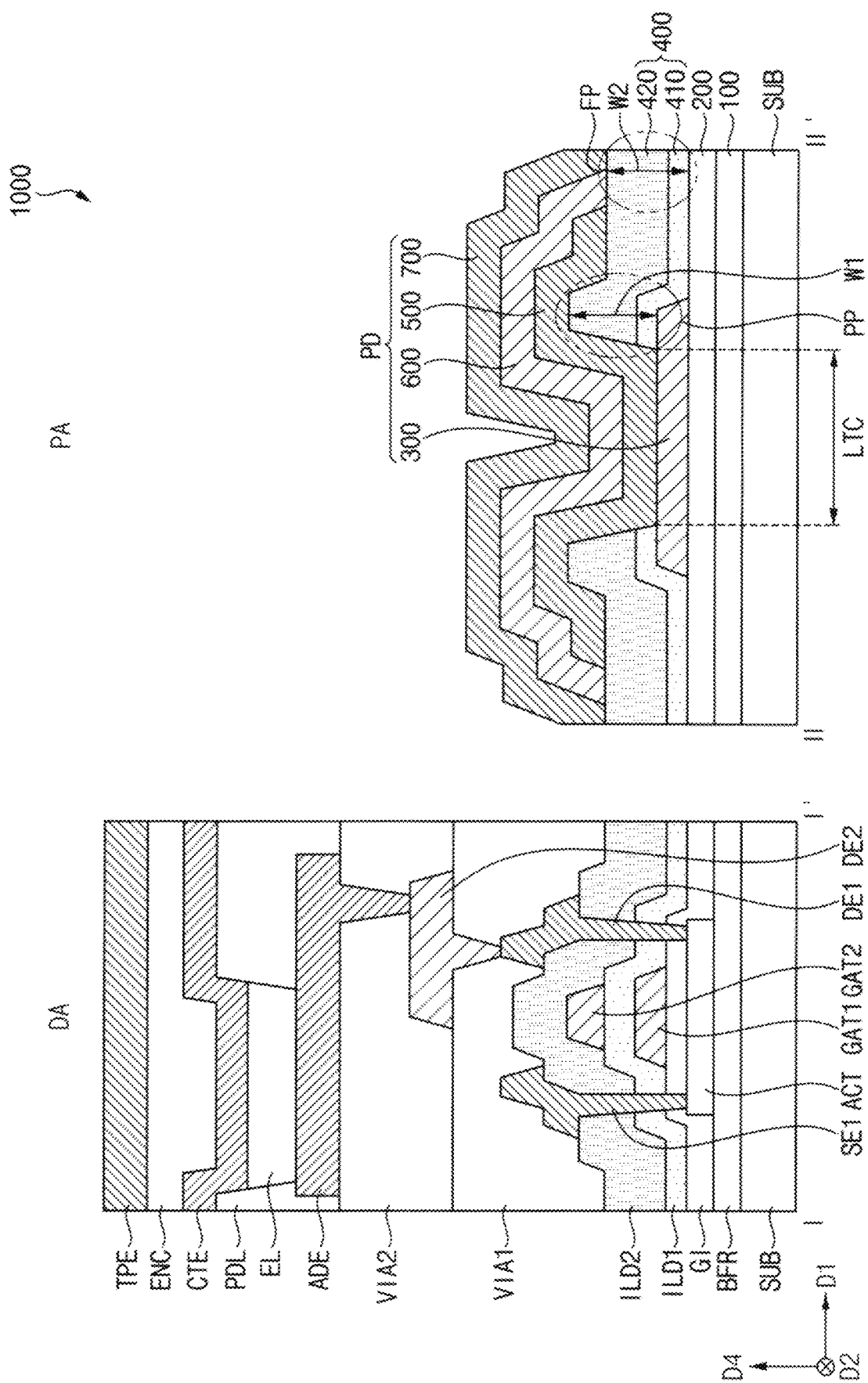
FIG. 4 and FIG. 5 are cross-sectional views illustrating the display device of FIG.
Figure 5:
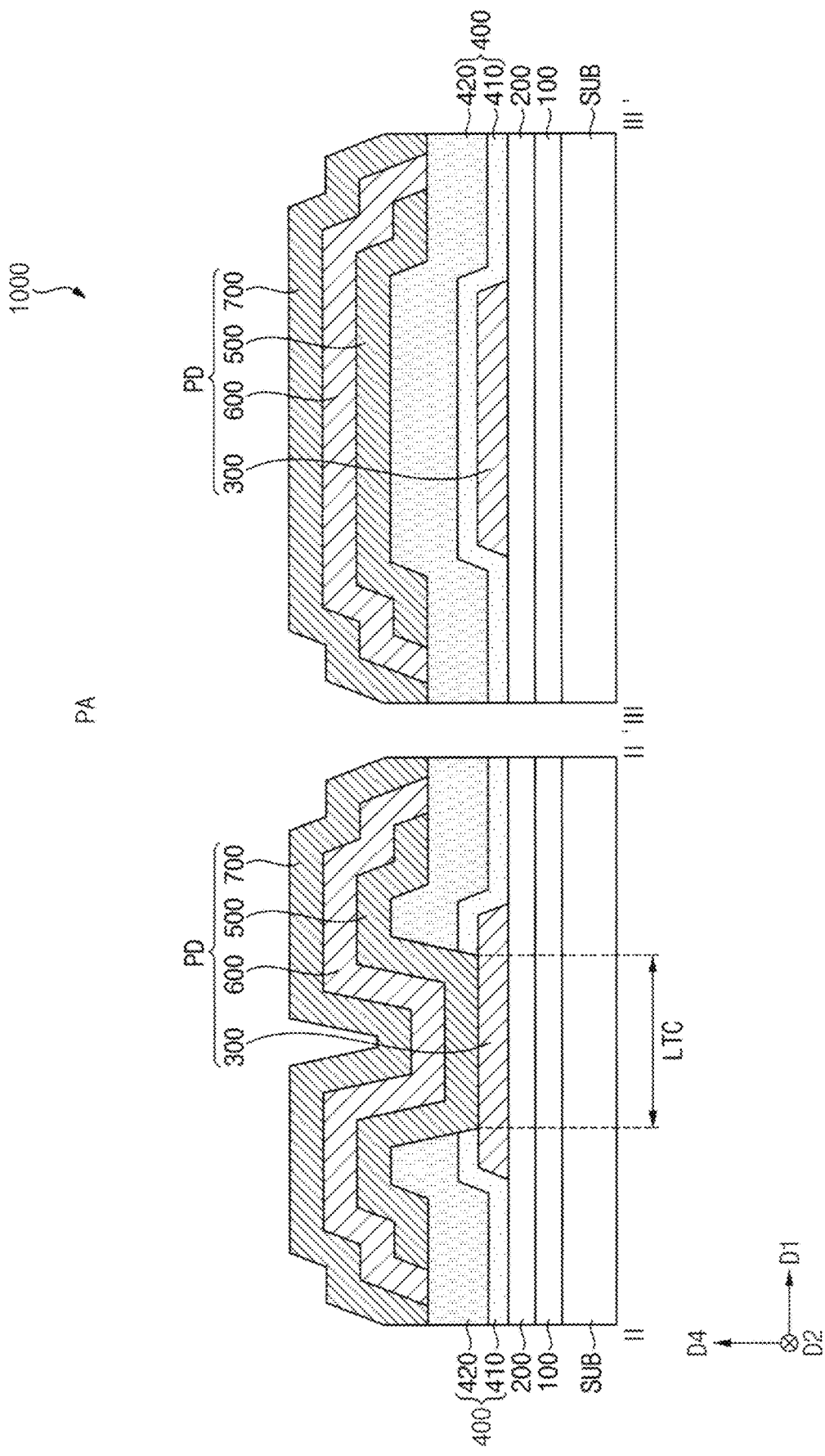

FIG. 3 is a plan view illustrating a pad included in the display device of FIG. 1. FIG. 4 and FIG. 5 are cross-sectional views illustrating the display device of FIG. 1. For example, a first cross-sectional view taken along line I-I' of FIG. 1 and a second cross-sectional view taken along line II-II' of FIG. 3 may be shown in FIG. 4. The second cross-sectional view and a third cross-sectional view taken along line III-III' of FIG. 3 may be shown in FIG. 5.

Referring to FIGS. 3, 4, and 5, a substrate SUB may include the display region DA and the pad region PA. The substrate SUB may be formed of or include a transparent or opaque material. For example, the substrate SUB may be formed of or include glass, quartz, plastic, or the like.

A buffer layer BFR may be disposed on the substrate SUB and may overlap the display region DA in a plan view. In other words, the buffer layer BFR may be disposed in the display region DA. In an embodiment, the buffer layer BFR may include an inorganic material. For example, the buffer layer BFR may include silicon oxide, silicon nitride, silicon oxynitride, or the like. The buffer layer BFR may prevent diffusion of metal atoms or impurities from the substrate SUB into an active pattern ACT. In addition, the buffer layer BFR may control a rate of heat supply during a crystallization process for forming the active pattern ACT.

The active pattern ACT may be disposed on the buffer layer BFR and may overlap the display region DA in a plan view. In an embodiment, the active pattern ACT may include a silicon semiconductor, an oxide semiconductor, or the like. For example, the active pattern ACT may include amorphous silicon, polycrystalline silicon, or metal oxide.

A gate insulating layer GI may cover the active pattern ACT and may overlap the display region DA in a plan view. In other words, gate insulating layer GI may be disposed in the display region DA. In an embodiment, the gate insulating layer GI may include an inorganic insulating material. For example, the gate insulating layer GI may include silicon oxide, silicon nitride, silicon oxynitride, or the like.

A first gate electrode GAT1 may be disposed on the gate insulating layer GI and may overlap the active pattern ACT in a plan view. In an embodiment, the first gate electrode GAT1 may include a metal, an alloy, a conductive metal oxide, a transparent conductive material, or the like. For example, the first gate electrode GAT1 may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. The first gate electrode GAT1 may constitute the first transistor T1 together with the active pattern ACT.

A first interlayer-insulating layer ILD1 may cover the first gate electrode GAT1 and may overlap the display region DA in a plan view. In an embodiment, the first interlayer-insulating layer ILD1 may include an inorganic insulating material. For example, the first interlayer-insulating layer ILD1 may include silicon oxide, silicon nitride, silicon oxynitride, or the like.

A second gate electrode GAT2 may be disposed on the first interlayer-insulating layer ILD1 and may overlap the first gate electrode GAT1 in a plan view. In an embodiment, the second gate electrode GAT2 may include a metal, an alloy, a conductive metal oxide, a transparent conductive material, or the like. For example, the second gate electrode GAT2 may include the same material as the first gate electrode GAT1. The second gate electrode GAT2 may form the storage capacitor CST together with the first gate electrode GAT1.

A second interlayer-insulating layer ILD2 may cover the second gate electrode GAT2 and may overlap the display region DA in a plan view. In an embodiment, the second interlayer-insulating layer ILD2 may include an inorganic insulating material. For example, the second interlayer-insulating layer ILD2 may include silicon oxide, silicon nitride, silicon oxynitride, or the like.

A first source electrode SE1 and a first drain electrode DE1 may be disposed on the second interlayer-insulating layer ILD2 and may contact the active pattern ACT. In an embodiment, the first source electrode SE1 and the first drain electrode DE1 each may include a metal, an alloy, a conductive metal oxide, a transparent conductive material, or the like. For example, the first source electrode SE1 and the first drain electrode DE1 each may have a Ti/Al/Ti structure.

A first via-insulating layer VIA1 may cover the first source electrode SE1 and the first drain electrode DE1 and may overlap the display region DA in a plan view. In other words, first via-insulating layer VIA1 may be disposed in the display region DA. In an embodiment, the first via-insulating layer VIA1 may include an organic insulating material. For example, the first via-insulating layer VIA1 may include a photoresist, a polyacrylic resin, a polyimide resin, an acrylic resin, or the like.

A second drain electrode DE2 may be disposed on the first via-insulating layer VIA1 and may contact the first drain electrode DE1. In an embodiment, the second drain electrode DE2 may include a metal, an alloy, a conductive metal oxide, a transparent conductive material, or the like. For example, the second drain electrode DE2 may have a Ti/Al/Ti structure.

A second via-insulating layer VIA2 may cover the second drain electrode DE2 and may overlap the display region DA in a plan view. In an embodiment, the second via-insulating layer VIA2 may include an organic insulating material.

A first electrode ADE may be disposed on the second via-insulating layer VIA2 and may contact the second drain electrode DE2. In an embodiment, the first electrode ADE may include a metal, an alloy, a conductive metal oxide, a transparent conductive material, or the like. For example, the first electrode ADE may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. In an embodiment, the first electrode ADE may have an ITO/Ag/ITO structure.

A pixel defining layer PDL may be disposed on the second via-insulating layer VIA2 and/or the first electrode ADE, and may overlap the display region DA in a plan view. In an embodiment, the pixel defining layer PDL may include an organic insulating material. An opening exposing an upper surface of the first electrode ADE may be defined in the pixel defining layer PDL.

The emission layer EL may be disposed in the opening. The emission layer EL may generate light based on the driving current ID. For example, the emission layer EL may include an organic light-emitting material.

The second electrode CTE may be disposed on the emission layer EL. In an embodiment, the second electrode CTE may include a metal, an alloy, a conductive metal oxide, a transparent conductive material, or the like. The first electrode ADE, the emission layer EL, and the second electrode CTE may constitute the organic light emitting diode OLED.

A light emitting diode included in the display device 1000 may not be limited to the organic light emitting diode OLED. In another embodiment, for example, the light emitting diode may include a micro light emitting diode ("micro-LED"), a nano light emitting diode ("nano-LED"), and a light emitting diode including at least one of a quantum dot ("QD"), or a quantum rod ("QR").

An encapsulation layer ENC may be disposed on the second electrode CTE. The encapsulation layer ENC may include an insulating material. In an embodiment, the encapsulation layer ENC may be an encapsulation substrate. For example, the encapsulation layer ENC may be a glass substrate, a plastic substrate, or an encapsulation film. In another embodiment, the encapsulation layer ENC may have a structure in which inorganic layers and organic layers are alternately stacked. The encapsulation layer ENC may prevent foreign matter from penetrating into the emission layer EL.

A sensing electrode TPE may be disposed on the encapsulation layer ENC. In an embodiment, the sensing electrode TPE may include a metal, an alloy, a conductive metal oxide, a transparent conductive material, or the like. For example, the sensing electrode TPE may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. The sensing electrode TPE may form a capacitance, and a user's touch may be sensed based on the amount of change in the capacitance.

A first lower insulating layer 100 may be disposed on the substrate SUB and may overlap the pad region PA in a plan view. In an embodiment, the first lower insulating layer 100 may include an inorganic material. For example, the first lower insulating layer 100 may include silicon oxide, silicon nitride, silicon oxynitride, or the like. In an embodiment, the first lower insulating layer 100 may be formed together with the buffer layer BFR.

A second lower insulating layer 200 may be disposed on the first lower insulating layer 100 and may overlap the pad region PA in a plan view. In an embodiment, the second lower insulating layer 200 may include an inorganic material. The second lower insulating layer 200 may be formed together with the gate insulating layer GI.

The pads PD may be disposed on the second lower insulating layer 200 and may overlap the pad region PA in a plan view. Each of the pads PD may include a first conductive pattern 300, a second conductive pattern 500, a third conductive pattern 600, and a fourth conductive pattern 700.

The first conductive pattern 300 may be disposed on the second lower insulating layer 200 and may overlap the pad region PA in a plan view. In an embodiment, the first conductive pattern 300 may include a metal, an alloy, a conductive metal oxide, a transparent conductive material, or the like. For example, the first conductive pattern 300 may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. The first conductive pattern 300 may be formed together with the first gate electrode GAT1.

In an embodiment, as shown in FIG. 3, the first conductive pattern 300 may have a quadrangle shape RS. The quadrangle shape RS may include a first side S1 extending in the first direction D1 and a second side S2 extending in the second direction D2. For example, a first length LNT1 of the first side S1 may be less than a second length LNT2 of the second side S2. For example, the first length LNT1 may be about 10 micrometers (μm) and the second length LNT2 may be about 50 μm to about 150 μm.

An insulating layer 400 may cover the first conductive pattern 300 and may overlap the pad region PA in a plan view. The insulating layer 400 may include a first insulating layer 410 and a second insulating layer 420.

The first insulating layer 410 may cover the first conductive pattern 300 and may overlap the pad region PA in a plan view. In an embodiment, the first insulating layer 410 may include an inorganic insulating material. For example, the first insulating layer 410 may include silicon oxide, silicon nitride, silicon oxynitride, or the like. The first insulating layer 410 may be formed together with the first interlayer-insulating layer ILD1.

The second insulating layer 420 may contact the first insulating layer 410 and may overlap the pad region PA in a plan view. In an embodiment, the second insulating layer 420 may include an inorganic insulating material. For example, the second insulating layer 420 may include silicon oxide, silicon nitride, silicon oxynitride, or the like. The second insulating layer 420 may be formed together with the second interlayer-insulating layer ILD2.

In an embodiment, as shown in FIG. 3, a plurality of contact holes CNT may be formed in the first insulating layer 410 and the second insulating layer 420. In other words, the contact holes CNT may penetrate through the first insulating layer 410 and the second insulating layer 420. Accordingly, the contact holes CNT may expose an upper surface of the first conductive pattern 300.

In an embodiment, the contact holes CNT may include a first contact hole CNT1, a second contact hole CNT2, and a third contact hole CNT3. The first contact hole CNT1, the second contact hole CNT2, and the third contact hole CNT3 may be arranged along a diagonal direction of the quadrangle shape RS. As used herein, the "diagonal direction of a quadrangle shape" includes any direction except for a direction of a vertical side and a direction of a horizontal side of the quadrangle shape. In detail, the first contact hole CNT1, the second contact hole CNT2, and the third contact hole CNT3 may be arranged along a first diagonal direction DD1 between the first direction D1 and the second direction D2. In an embodiment, the first diagonal direction DD1 may be a direction from a lower left vertex to an upper right vertex of the quadrangle shape RS. However, the first diagonal direction DD1 according to the invention is not limited thereto.

In an embodiment, the first length LNT1 may be greater than a length (e.g., diameter) LTC of each of the contact holes CNT at the bottom thereof and in the first direction D1. For example, the first length LNT1 may be about 3 times greater than the length LTC of each of the contact holes CNT. The first length LNT1 may be greater than about 9 micrometers (μm), and the length LTC of each of the contact holes CNT may be less than about 3 μm. In addition, in an embodiment, an area of each of the contact holes CNT may be smaller than 7 square-micrometers (μm²). In an embodiment, the first insulating layer 410 and the second insulating layer 420 may include an overlapping portion PP and a non-overlapping portion FP. The overlapping portion PP may surround the contact holes CNT and may overlap the first conductive pattern 300 in a plan view. A top of the non-overlapping portion FP may be disposed lower than a top of the overlapping portion PP. A first thickness W1 of the overlapping portion PP may be the same as a second thickness W2 of the non-overlapping portion FP in a thickness direction (i.e., fourth direction D4). The fourth direction D4 is perpendicular to a plane defined by the first direction D1 and the second direction D2. For example, each of the first thickness W1 and the second thickness W2 may be about 6000 angstroms (Å) to about 7000 angstroms. A thickness of the first insulating layer 410 may be about 1400 angstroms, and a thickness of the second insulating layer 420 may be about 5000 angstroms.

The second conductive pattern 500 may be disposed on the second insulating layer 420 and may overlap the pad region PA in a plan view. In an embodiment, the second conductive pattern 500 may include a metal, an alloy, a conductive metal oxide, a transparent conductive material, or the like. A material included in the second conductive pattern 500 may be different from a material included in the first conductive pattern 300. For example, the second conductive pattern 500 may be formed together with the first source electrode SE1 and the first drain electrode DE1 and may have a Ti/Al/Ti structure.

In an embodiment, the second conductive pattern 500 may contact the first conductive pattern 300 through the first contact hole CNT1, the second contact hole CNT2, and the third contact hole CNT3.

The third conductive pattern 600 may be disposed on the second conductive pattern 500 and may overlap the pad region PA in a plan view. The third conductive pattern 600 may directly contact the second conductive pattern 500. In an embodiment, the third conductive pattern 600 may include a metal, an alloy, a conductive metal oxide, a transparent conductive material, or the like. A material included in the third conductive pattern 600 may be the same as the material included in the second conductive pattern 500. For example, the third conductive pattern 600 may be formed together with the second drain electrode DE2 and may have a Ti/Al/Ti structure.

The fourth conductive pattern 700 may be disposed on the third conductive pattern 600 and may overlap the pad region PA in a plan view. The fourth conductive pattern 700 may directly contact the third conductive pattern 600. In an embodiment, the fourth conductive pattern 700 may include a metal, an alloy, a conductive metal oxide, a transparent conductive material, or the like. For example, the fourth conductive pattern 700 may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. The fourth conductive pattern 700 may be formed together with the sensing electrode TPE.

The display device 1000 may include the pads PD, and each of the pads PD may include the first to fourth conductive patterns 300, 500, 600, and 700. The second conductive pattern 500 may contact the first conductive pattern 300 through the contact holes CNT.

In an embodiment, the length LTC (or area) of each of the contact holes CNT may be set significantly smaller than the first length LNT1 (or area) of the first conductive pattern 300. In other words, the second conductive pattern 500 may contact the first conductive pattern 300 with a point. Accordingly, a stepped region existing in the upper surface of the second conductive pattern 500 may be minimized, and each of the pads PD may have a substantially flat upper surface. Accordingly, while the rework process is performed, shapes of the pads PD may not be deformed, and a short defect between the pads PD may be prevented.

In addition, in an embodiment, the contact holes CNT may be arranged in the first diagonal direction DD1. Accordingly, the indentation inspection process may be easily performed. In other words, as the contact holes CNT are arranged in the first diagonal direction DD1, the pressure applied to the terminals CP, the conductive balls, and the pads PD may be easily inspected.

FIGS. 6 to 11 are cross-sectional views illustrating a method for manufacturing the display device of FIG. 1.

Figure 6:
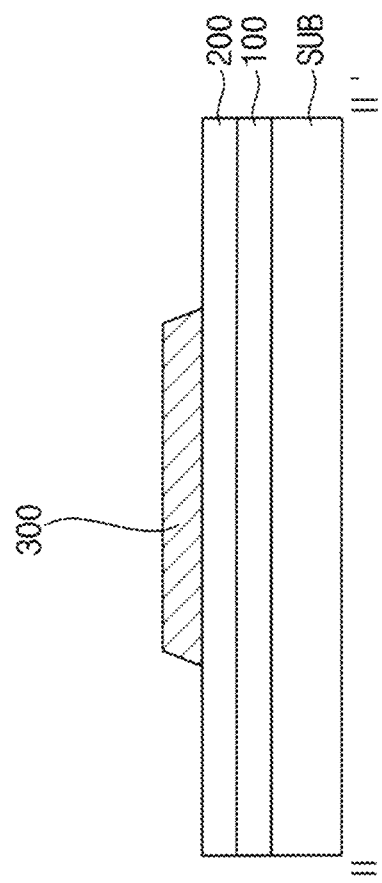
FIGS. 6 to 11 are cross-sectional views illustrating a method for manufacturing the display device of FIG. 1.
Figure 6:
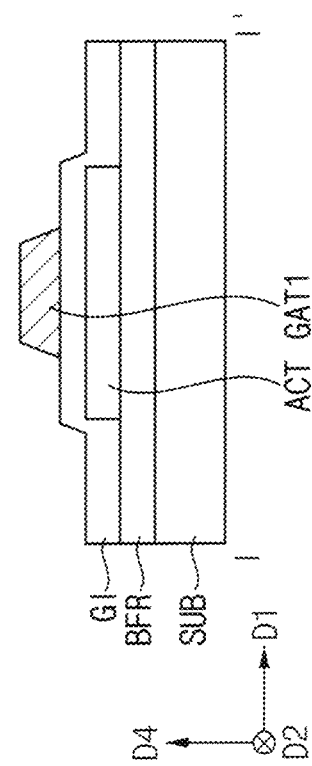

Referring to FIGS. 1, 4, and 6, the buffer layer BFR and the first lower insulating layer 100 may be formed together on the substrate SUB, and the active pattern ACT may be disposed on the buffer layer BFR. The gate insulating layer GI and the second lower insulating layer 200 may be formed together, and the first gate electrode GAT1 and the first conductive pattern 300 may be formed together. For example, after a metal layer is formed on the gate insulating layer GI and the second lower insulating layer 200, the metal layer may be patterned.

Figure 7:
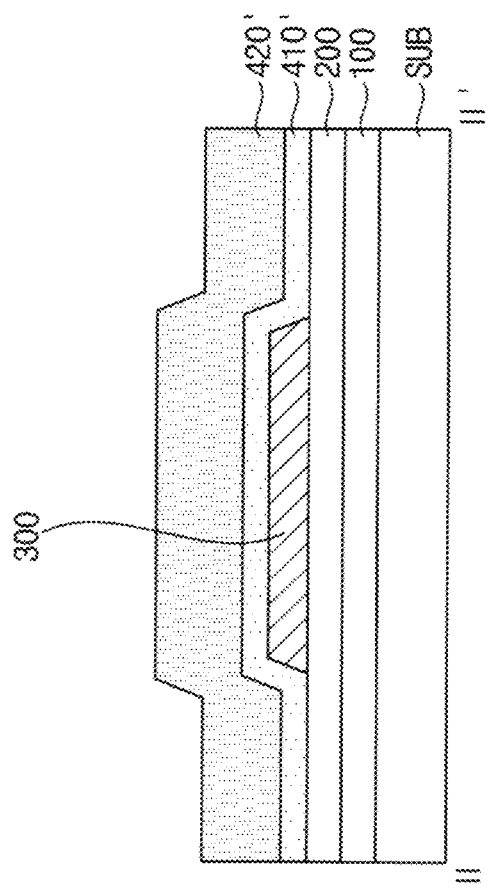
Figure 7:
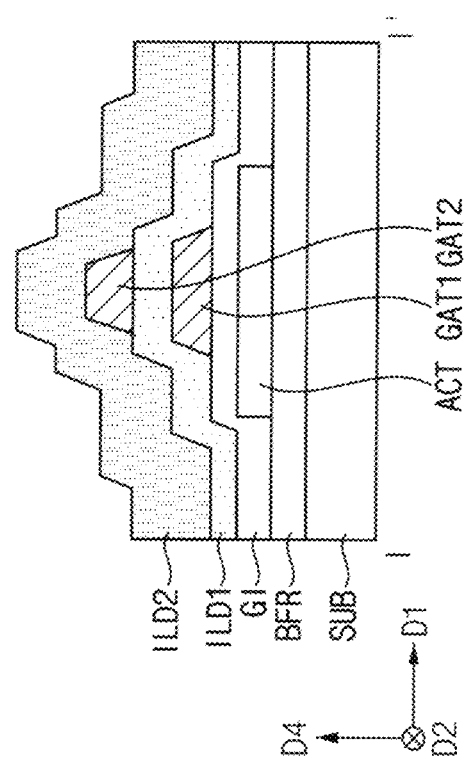

Referring to FIGS. 1, 4, and 7, the first interlayer-insulating layer ILD1 and a first preliminary insulating layer 410' may be formed together, and the second gate electrode GAT2 may be formed. The first interlayer-insulating layer ILD1 may cover the first gate electrode GAT1, and the first preliminary insulating layer 410' may cover the first conductive pattern 300. The second interlayer-insulating layer ILD2 and a second preliminary insulating layer 420' may be formed together. The second interlayer-insulating layer ILD2 may contact the first interlayer-insulating layer ILD1, and the second preliminary insulating layer 420' may contact the first preliminary insulating layer 410'.

Figure 8:
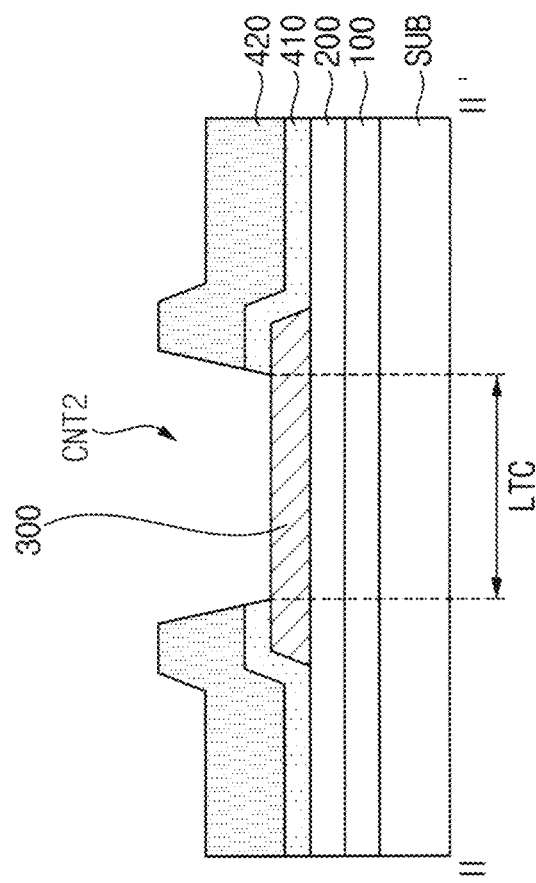
Figure 8:
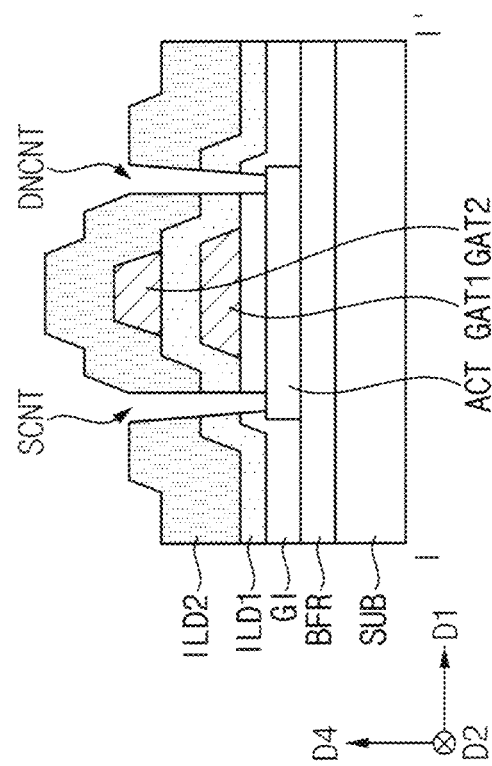

Referring to FIGS. 1, 4, and 8, a source contact hole SCNT, a drain contact hole DCNT, and the contact holes CNT may be formed together. The source contact hole SCNT and the drain contact hole DCNT may pass through the gate insulating layer GI, the first interlayer-insulating layer ILD1, and the second interlayer-insulating layer ILD2. The source contact hole SCNT may expose a source region of the active pattern ACT, and the drain contact hole DCNT may expose a drain region of the active pattern ACT. The contact holes CNT may pass through the first preliminary insulating layer 410' and the second preliminary insulating layer 420'. Each of the contact holes CNT may expose an upper surface of the first conductive pattern 300 by the length LTC. Accordingly, the first insulating layer 410 and the second insulating layer 420 may be formed.

Figure 9:
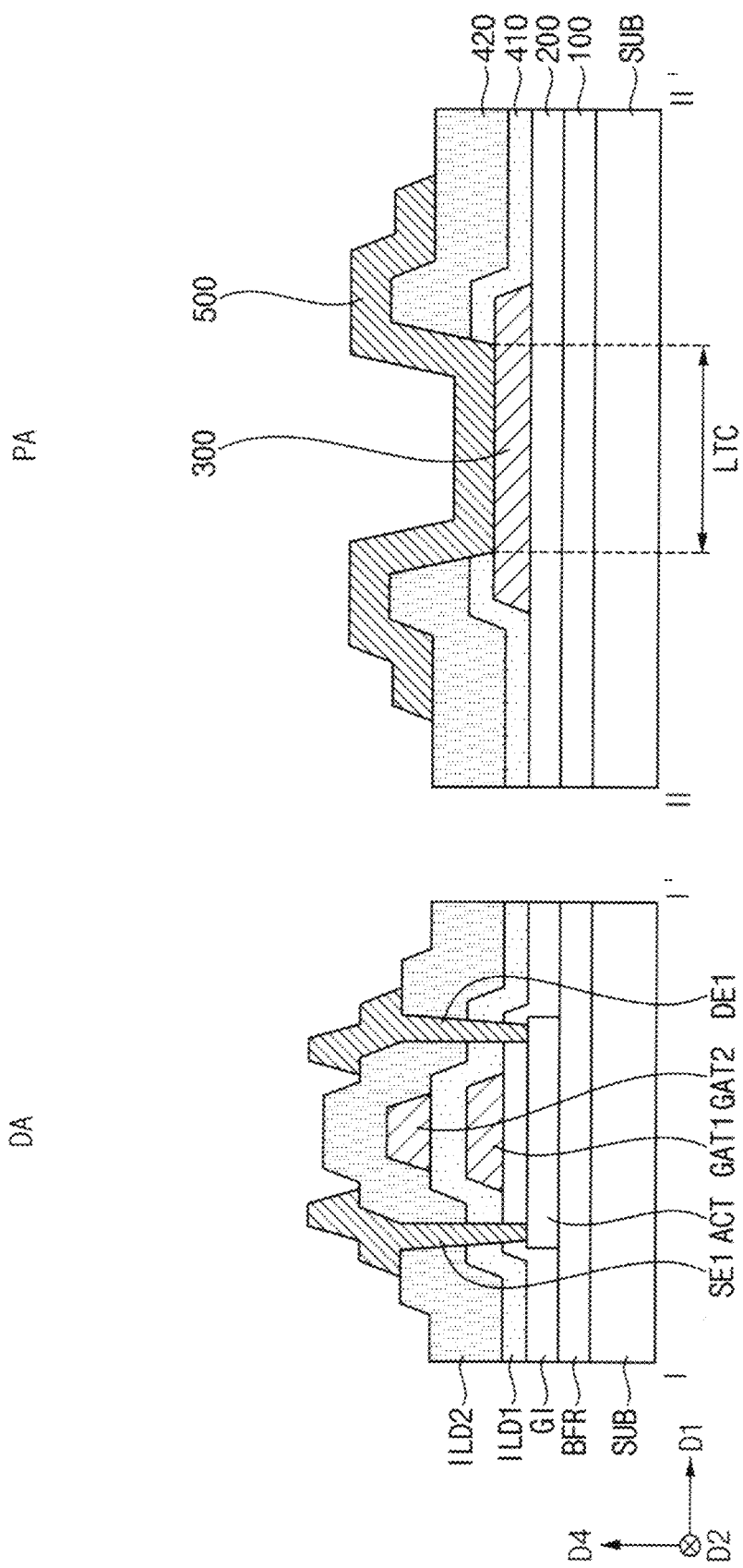

Referring to FIGS. 1, 4, and 9, the first source electrode SE1, the first drain electrode DE1, and the second conductive pattern 500 may be formed together. The first source electrode SE1 and the first drain electrode DE1 may be formed on the second interlayer-insulating layer ILD2. The first source electrode SE1 may fill the source contact hole SCNT, and the first drain electrode DE1 may fill the drain contact hole DCNT. The second conductive pattern 500 may be formed on the second insulating layer 420 and may fill the contact holes CNT. Accordingly, the second conductive pattern 500 may contact the first conductive pattern 300.

Figure 10:
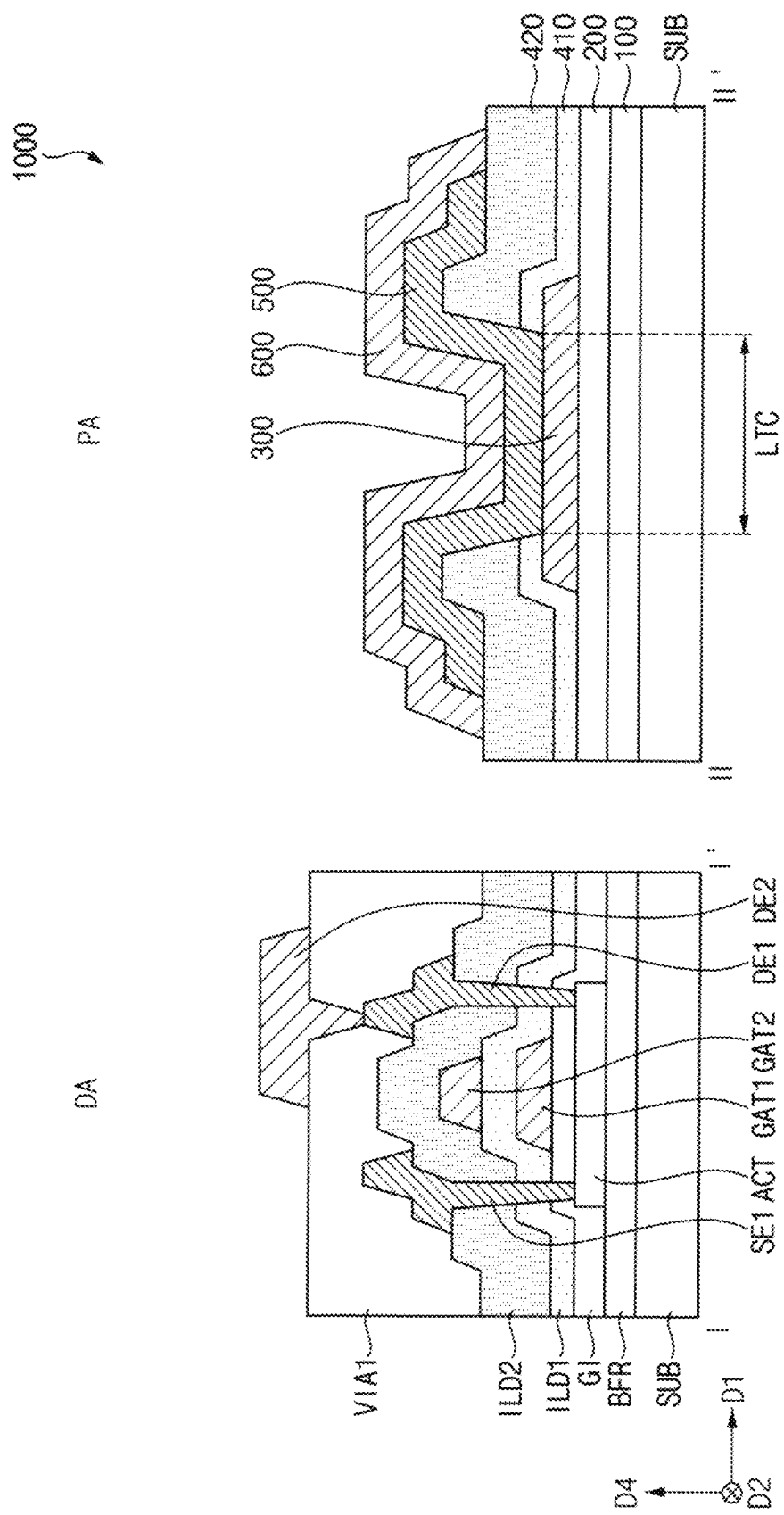

Referring to FIGS. 1, 4, and 10, the first via-insulating layer VIA1 may be formed, and the second drain electrode DE2 and the third conductive pattern 600 may be formed together. The second drain electrode DE2 may contact the first drain electrode DE1, and the third conductive pattern 600 may contact the second conductive pattern 500.

Figure 11:
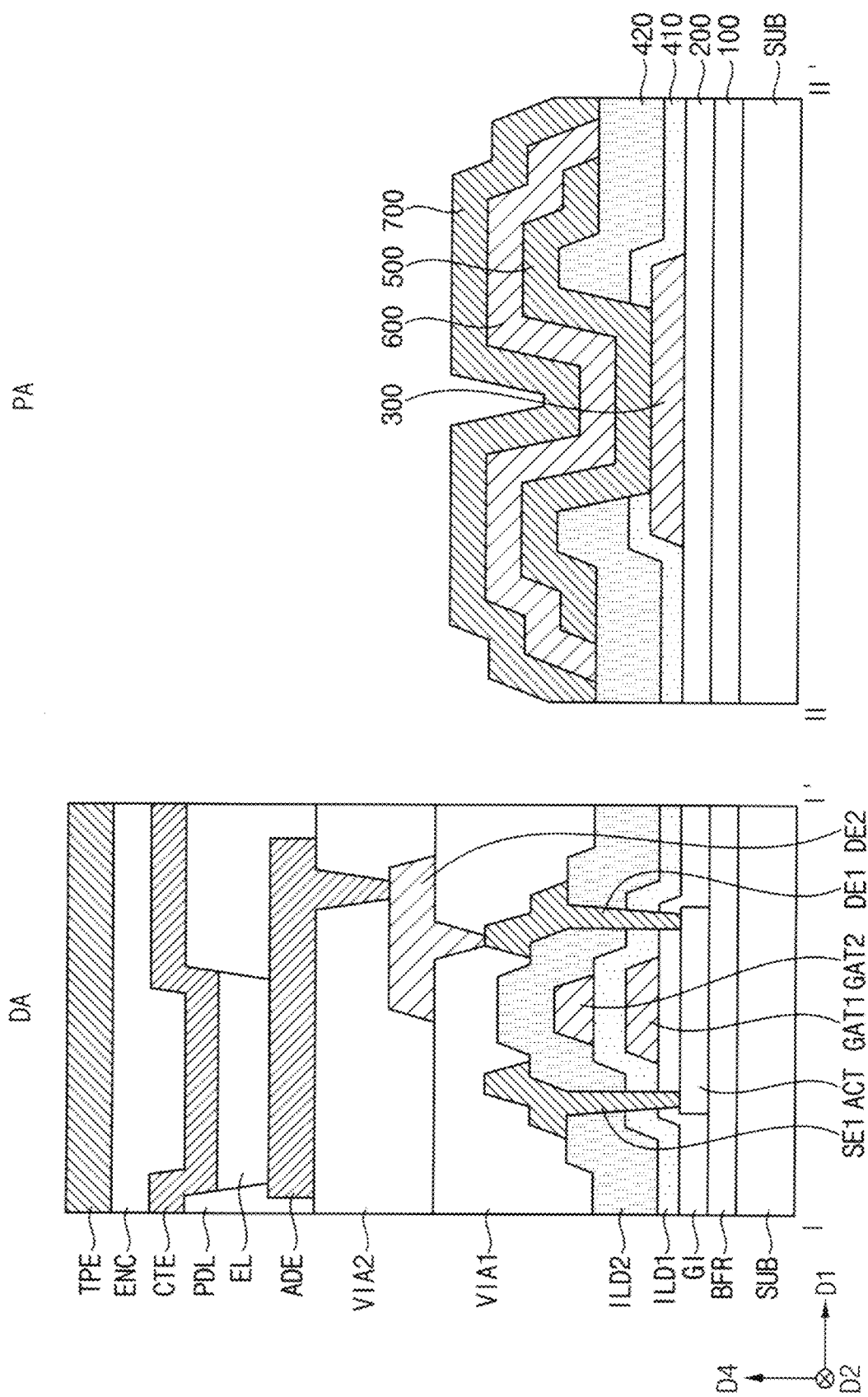

Referring to FIGS. 1, 4, and 11, the second via-insulating layer VIA2, the first electrode ADE, the pixel defining layer PDL, the emission layer EL, the second electrode CTE, and the encapsulation layer ENC may be sequentially formed, and the sensing electrode TPE and the fourth conductive pattern 700 may be formed together. The fourth conductive pattern 700 may contact the third conductive pattern 600 and may have a substantially flat top surface.

Figure 12:
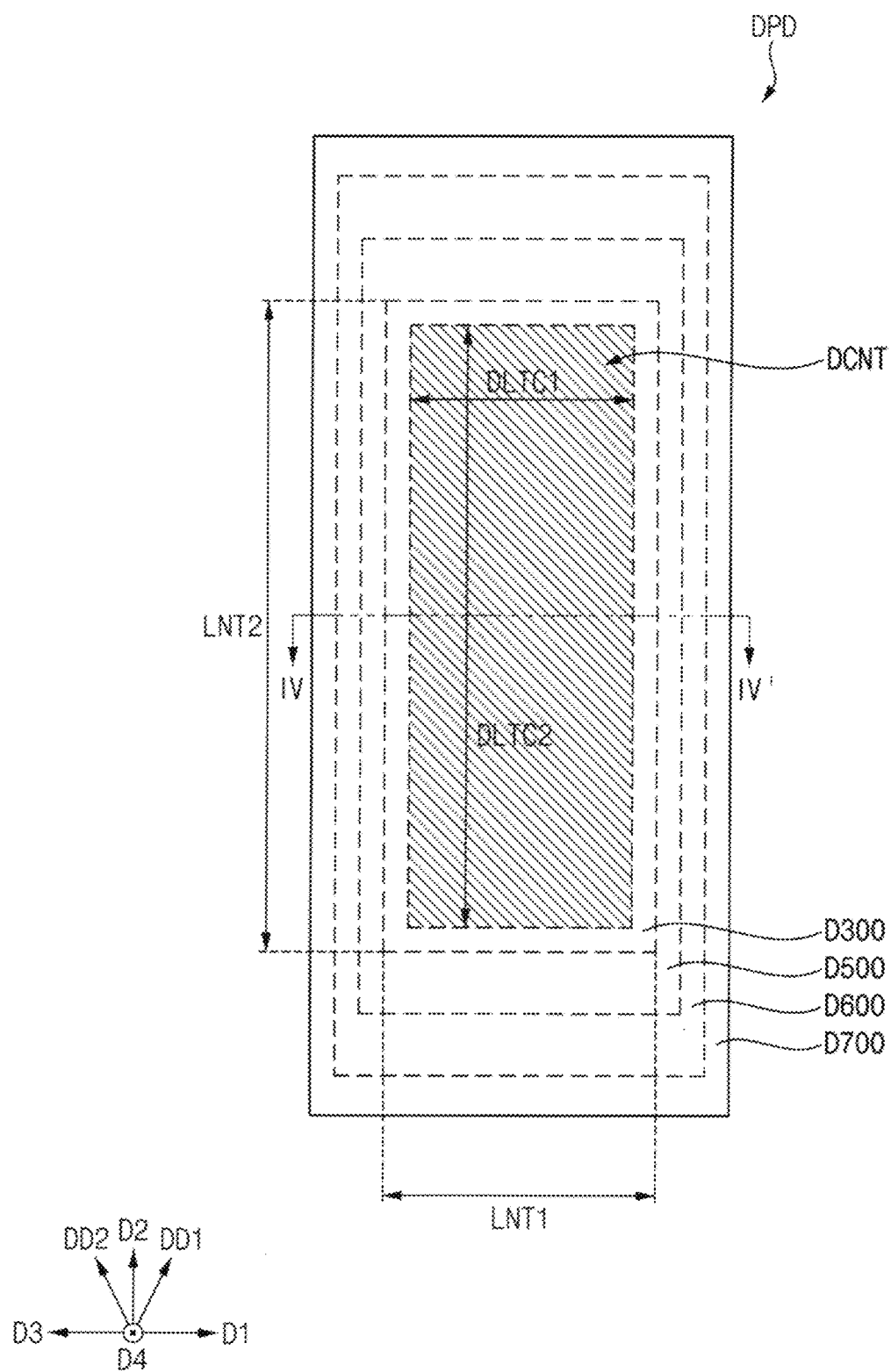
FIG. 12 is a plan view illustrating a dummy pad included in the display device of FIG. 1.
Figure 13:
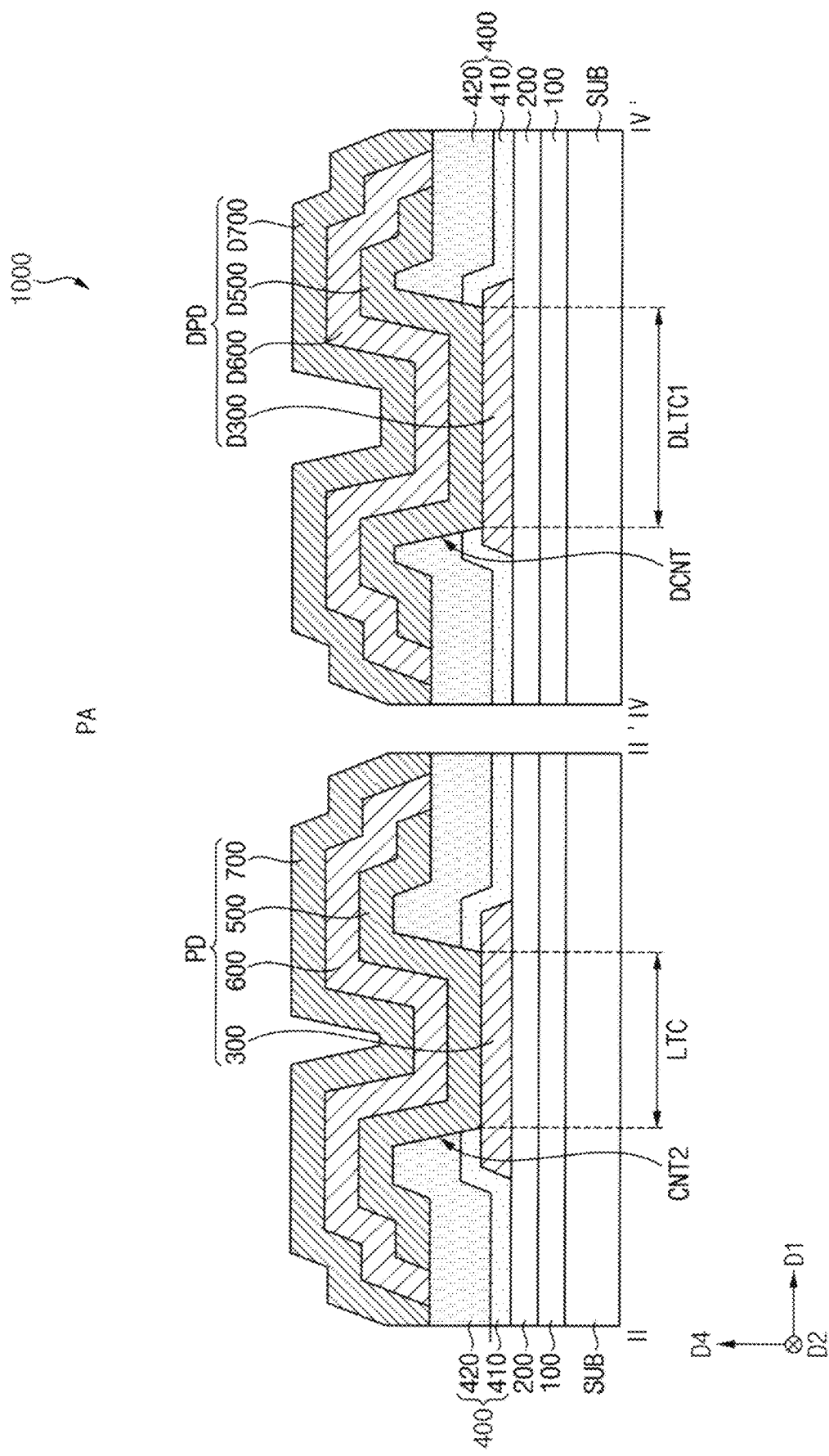
FIG. 13 is a cross-sectional view illustrating the display device of FIG. 1.

FIG. 12 is a plan view illustrating a dummy pad included in the display device of FIG. 1. FIG. 13 is a cross-sectional view illustrating the display device of FIG. 1. For example, the second cross-sectional view taken along line II-IF of FIG. 3 and a fourth cross-sectional view taken along line IV-IV' of FIG. 12 may be shown in FIG. 13.

The dummy pads DPD may be disposed on the second lower insulating layer 200 and may overlap the pad region PA in a plan view. Each of the dummy pads DPD may include a first dummy pattern D300, a second dummy pattern D500, a third dummy pattern D600, and a fourth dummy pattern D700.

The first dummy pattern D300 may be disposed on the second lower insulating layer 200 and may overlap the pad region PA. In an embodiment, the first dummy pattern D300 may include a metal, an alloy, a conductive metal oxide, a transparent conductive material, or the like. For example, the first dummy pattern D300 may be formed together with the first conductive pattern 300 and may include the same material as the first conductive pattern 300.

In an embodiment, as shown in FIG. 12, the first dummy pattern D300 may have a rectangular shape. The rectangular shape may be substantially the same as the rectangular shape RS described with reference to FIG. 3.

In an embodiment, as shown in FIG. 12, a single dummy contact hole DCNT may be formed in the first insulating layer 410 and the second insulating layer 420. In other words, the dummy contact hole DCNT may pass through the first insulating layer 410 and the second insulating layer 420. Accordingly, the dummy contact hole DCNT may expose a top surface of the first dummy pattern D300.

In an embodiment, a first dummy contact hole length DLTC1 of the dummy contact hole DCNT in the first direction D1 may be greater than the length LTC of each of the contact holes CNT. In addition, a second dummy contact hole length DLTC2 of the dummy contact hole DCNT in the second direction D2 may be greater than the length LTC. In an embodiment, an area of the dummy contact hole DCNT may be greater than about 500 μm². In other words, the area of the dummy contact hole DCNT may be greater than the area of each of the contact holes CNT.

The second dummy pattern D500 may be disposed on the second insulating layer 420 and may overlap the pad region PA. In an embodiment, the second dummy pattern D500 may include a metal, an alloy, a conductive metal oxide, a transparent conductive material, or the like. For example, the second dummy pattern D500 may be formed together with the second conductive pattern 500 and may include the same material as the second conductive pattern 500.

In an embodiment, the second dummy pattern D500 may contact the first dummy pattern D300 through the dummy contact hole DCNT.

The third dummy pattern D600 may be disposed on the second dummy pattern D500 and may overlap the pad region PA. The third dummy pattern D600 may directly contact the second dummy pattern D500. In an embodiment, the third dummy pattern D600 may include a metal, an alloy, a conductive metal oxide, a transparent conductive material, or the like. For example, the third dummy pattern D600 may be formed together with the third conductive pattern 600 and may include the same material as the third conductive pattern 600.

The fourth dummy pattern D700 may be disposed on the third dummy pattern D600 and may overlap the pad region PA. The fourth dummy pattern D700 may directly contact the third dummy pattern D600. In an embodiment, the fourth dummy pattern D700 may include a metal, an alloy, a conductive metal oxide, a transparent conductive material, or the like. For example, the fourth dummy pattern D700 may be formed together with the fourth conductive pattern 700 and may include the same material as the fourth conductive pattern 700.

The display device 1000 may include the dummy pads DPD, and each of the dummy pads DPD may include the first to fourth dummy patterns D300, D500, D600, and D700. The second dummy pattern D500 may contact the first dummy pattern D300 through the dummy contact hole DCNT.

In an embodiment, the first dummy contact hole length DLTC1 (or the second dummy contact hole length DLTC2) of the dummy contact hole DCNT may be set significantly greater the length LTC of each of the contact holes CNT. In other words, the second dummy pattern D500 may contact the first dummy pattern D300 with a surface. In other words, the areas of the first insulating layer 410 and the second insulating layer 420 which are removed to form the dummy pads DPD may increase. Accordingly, the number of layers stacked to form the dummy pads DPD may be reduced and visibility of the dummy pads DPD may be improved. Therefore, the indentation inspection process performed on the dummy pads DPD may be more easily performed. Through this, the indentation state of the pads PD may be more easily checked.

Figure 14:
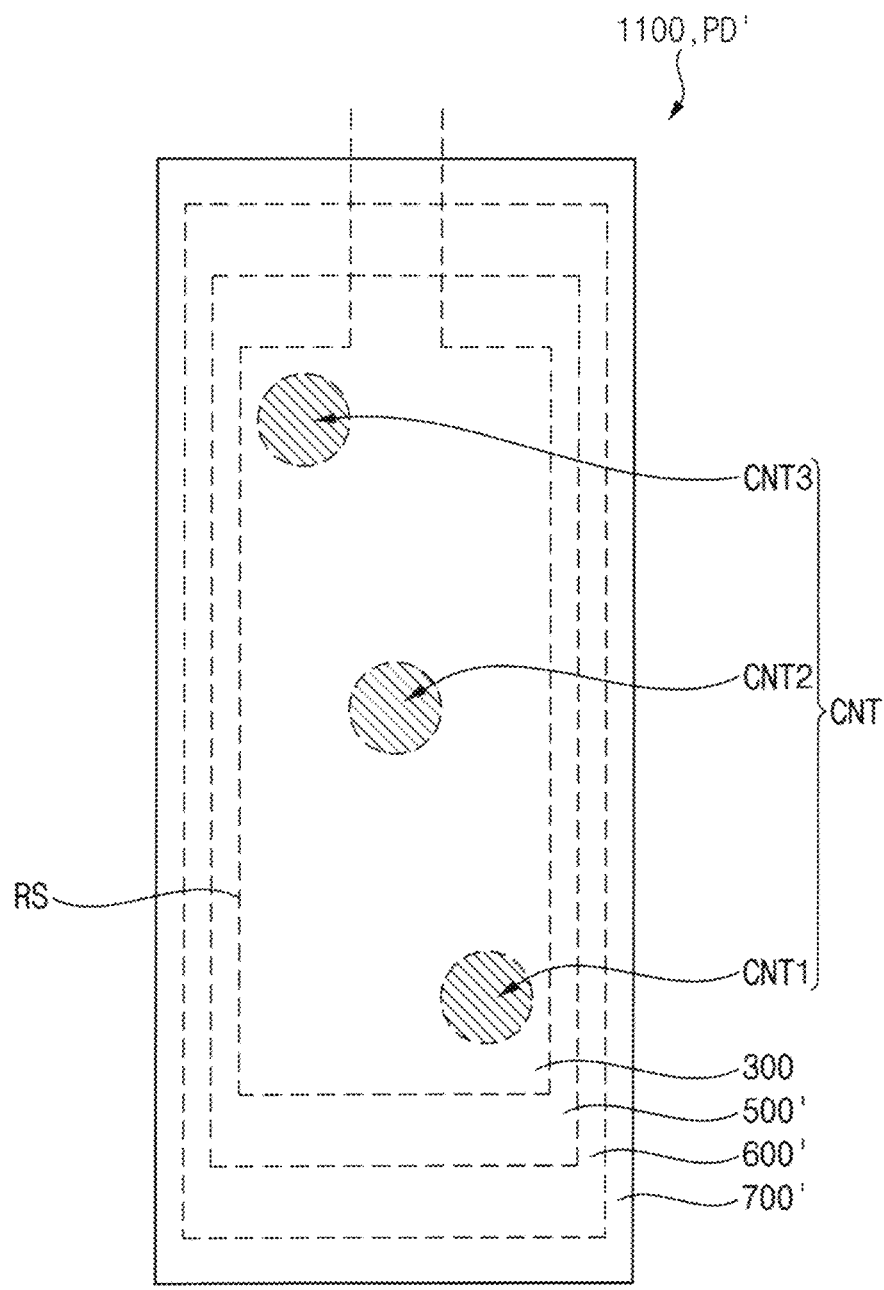
FIG. 14 is a plan view illustrating a display device according to another embodiment.
Figure 14:
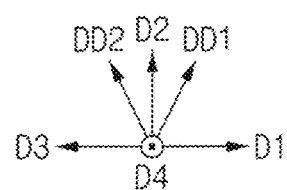

FIG. 14 is a plan view illustrating a display device according to another embodiment.

Referring to FIG. 14, a display device 1100 according to another embodiment may include a plurality of pads PD' and a plurality of dummy pads. However, the display device 1100 may be substantially the same as the display device 1000 described with reference to FIGS. 1 and 3 except for the pads PD'.

The pads PD' may include the first conductive pattern 300, a second conductive pattern 500', a third conductive pattern 600', and a fourth conductive pattern 700'. The first conductive pattern 300 may be substantially the same as the first conductive pattern 300 described with reference to FIGS. 3 and 4. However, as positions of the contact holes CNT are changed, arrangement of the second conductive pattern 500', the third conductive pattern 600', and the fourth conductive pattern 700' may be different from the arrangement of the second conductive pattern 500, the third conductive pattern 600, and the fourth conductive pattern 700 described with reference to FIGS. 3 and 4.

In detail, in an embodiment, the contact holes CNT may include a first contact hole CNT1, a second contact hole CNT2, and a third contact hole CNT3. The first contact hole CNT1, the second contact hole CNT2, and the third contact hole CNT3 may be arranged along a diagonal direction of the quadrangle shape RS. For example, the first contact hole CNT1, the second contact hole CNT2, and the third contact hole CNT3 may be arranged along a second diagonal direction DD2 between a third direction D3 and the second direction D2. The third direction D3 is opposite to the first direction D1. In an embodiment, the second diagonal direction DD2 may be a direction from a lower right vertex to an upper left vertex of the quadrangle shape RS. However, the second diagonal direction DD2 according to the invention is not limited thereto.

The second conductive pattern 500' may be disposed on the first conductive pattern 300, and may contact the first conductive pattern 300 through the first to third contact holes CNT1, CNT2, and CNT3. The third conductive pattern 600' may be disposed on the second conductive pattern 500' and may contact the second conductive pattern 500'. The fourth conductive pattern 700' may be disposed on the third conductive pattern 600' and may contact the third conductive pattern 600'

Figure 15:
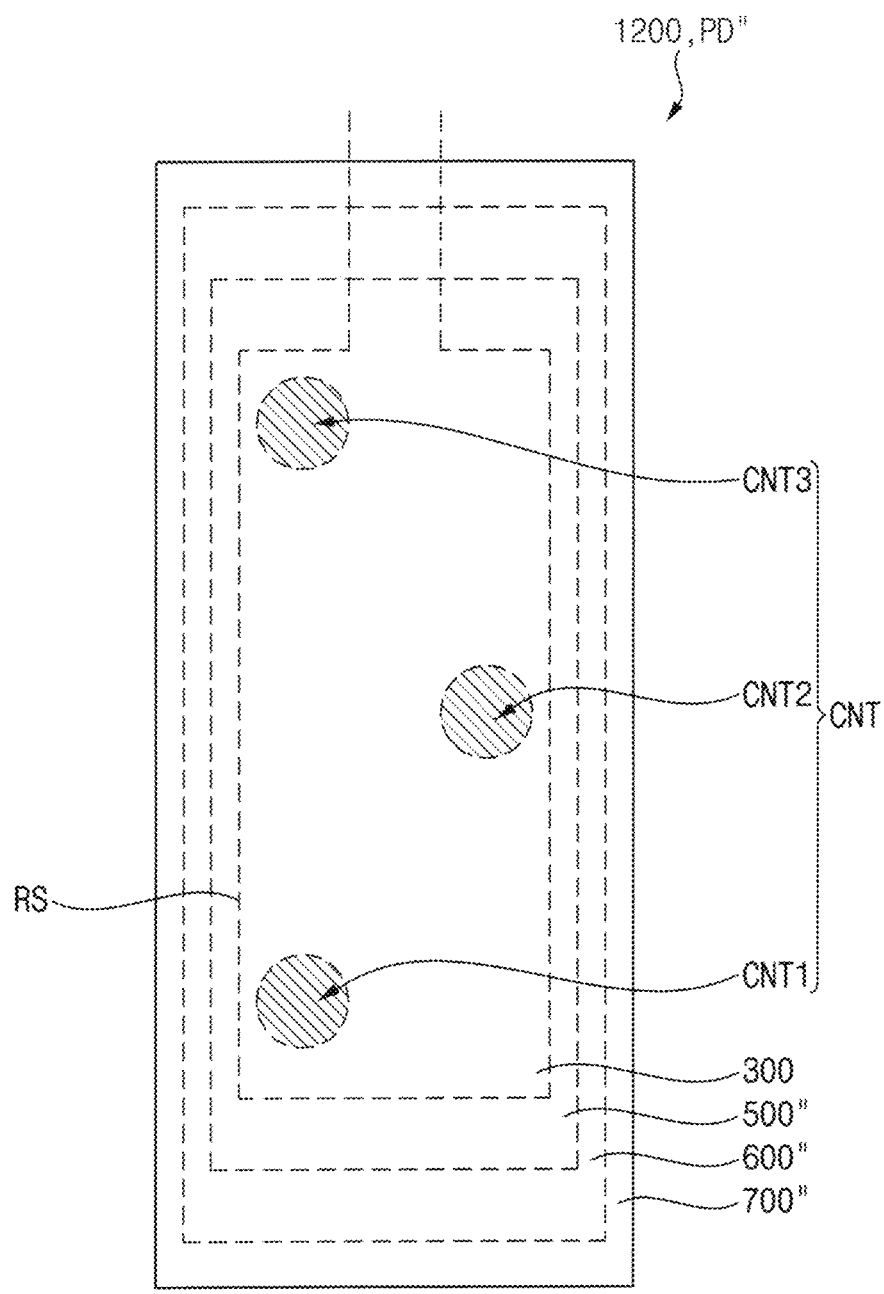
FIG. 15 is a plan view illustrating a display device according to still another embodiment.
Figure 15:
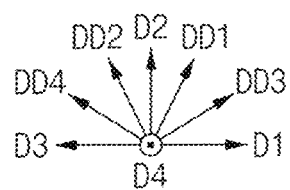

FIG. 15 is a plan view illustrating a display device according to still another embodiment.

Referring to FIG. 15, a display device 1200 according to still another embodiment may include a plurality of pads PD" and a plurality of dummy pads. However, the display device 1200 may be substantially the same as the display device 1000 described with reference to FIGS. 1 and 3 except for the pads PD".

The pads PD" may include the first conductive pattern 300, a second conductive pattern 500", a third conductive pattern 600", and a fourth conductive pattern 700". The first conductive pattern 300 may be substantially the same as the first conductive pattern 300 described with reference to FIGS. 3 and 4. However, as positions of the contact holes CNT are changed, arrangement of the second conductive pattern 500", the third conductive pattern 600" and the fourth conductive pattern 700" may be different from the arrangement of the second conductive pattern 500, the third conductive pattern 600, and the fourth conductive pattern 700 described with reference to FIGS. 3 and 4.

In detail, in an embodiment, the contact holes CNT may include a first contact hole CNT1, a second contact hole CNT2, and a third contact hole CNT3. The first contact hole CNT1 and the second contact hole CNT2 may be arranged along a third diagonal direction DD3 of the quadrangle shape RS, and the second contact hole CNT2 and the third contact hole CNT3 may be arranged along a fourth diagonal direction DD4 of the quadrangle shape RS. Here, the third diagonal direction DD3 may be between the first diagonal direction DD1 and the first direction D1 as shown in FIG. 15, and the angle of the third diagonal direction DD3 with respect to the first direction D1 may be less than the angle of the first diagonal direction DD1 with respect to the first direction D1 counterclockwise. The fourth diagonal direction DD4 may be between the second diagonal direction DD2 and the third direction D3 as shown in FIG. 15, and the angle of the fourth diagonal direction DD4 with respect to the third direction D3 may be less than the angle of the second diagonal direction DD2 with respect to the third direction D3 clockwise. The third diagonal direction DD3 may cross the fourth diagonal direction DD4. Accordingly, the first contact hole CNT1 and the third contact hole CNT3 may be arranged side by side along the second direction D2. Therefore, when viewed in a plan view, the first to third contact holes CNT1 to CNT3 may be arranged in a triangular shape.

The second conductive pattern 500" may be disposed on the first conductive pattern 300, and may contact the first conductive pattern 300 through the first to third contact holes CNT1, CNT2, and CNT3. The third conductive pattern 600" may be disposed on the second conductive pattern 500" and may contact the second conductive pattern 500". The fourth conductive pattern 700" may be disposed on the third conductive pattern 600" and may contact the third conductive pattern 600".

The display device 1000, 1100, or 1200 according to embodiments may include a plurality of pads PD, PD', or PD" and a plurality of dummy pads DPD.

Each of the pads PD, PD', or PD" may include the first conductive pattern 300 and the second conductive pattern 500, 500', or 500" contacting the first conductive pattern 300 through the contact holes CNT. The length LTC (or area) of each of the contact holes may be set significantly smaller than the first length LNT1 (or area) of the first conductive pattern. In other word, the second conductive pattern may contact the first conductive pattern with a point. Accordingly, a stepped region existing in the upper surface of the second conductive pattern 500, 500', or 500" may be minimized, and each of the pads PD, PD', or PD" may have a substantially flat upper surface. Accordingly, while the rework process is performed, shapes of the pads PD, PD', or PD" may not be deformed, and a short defect between the pads PD, PD', or PD" may be prevented.

In addition, the contact holes CNT may be arranged along the third diagonal direction DD3 and/or the fourth diagonal direction DD4. Accordingly, the indentation inspection process may be easily performed. In other words, as the contact holes CNT are arranged along the third diagonal direction DD3 and/or the fourth diagonal direction DD4, the pressure applied to the terminals CP, the conductive balls, and the pads PD may be easily inspected.

In addition, each of the dummy pads DPD may include the first dummy pattern D300 and the second dummy pattern D500 contacting the first dummy pattern D300 through the dummy contact hole DCNT. A length (or area) of the dummy contact hole DCNT may be set significantly greater than a length (or area) of each of the contact holes CNT. In other words, the second dummy pattern D500 may contact the first dummy pattern D300 with a surface. Accordingly, the number of layers stacked to form the dummy pads DPD may be reduced, and visibility of the dummy pads DPD may be improved. Therefore, the indentation inspection process performed on the dummy pads DPD may be more easily performed. Through this, the indentation state of the pads PD may be more easily checked.

Figure 16:
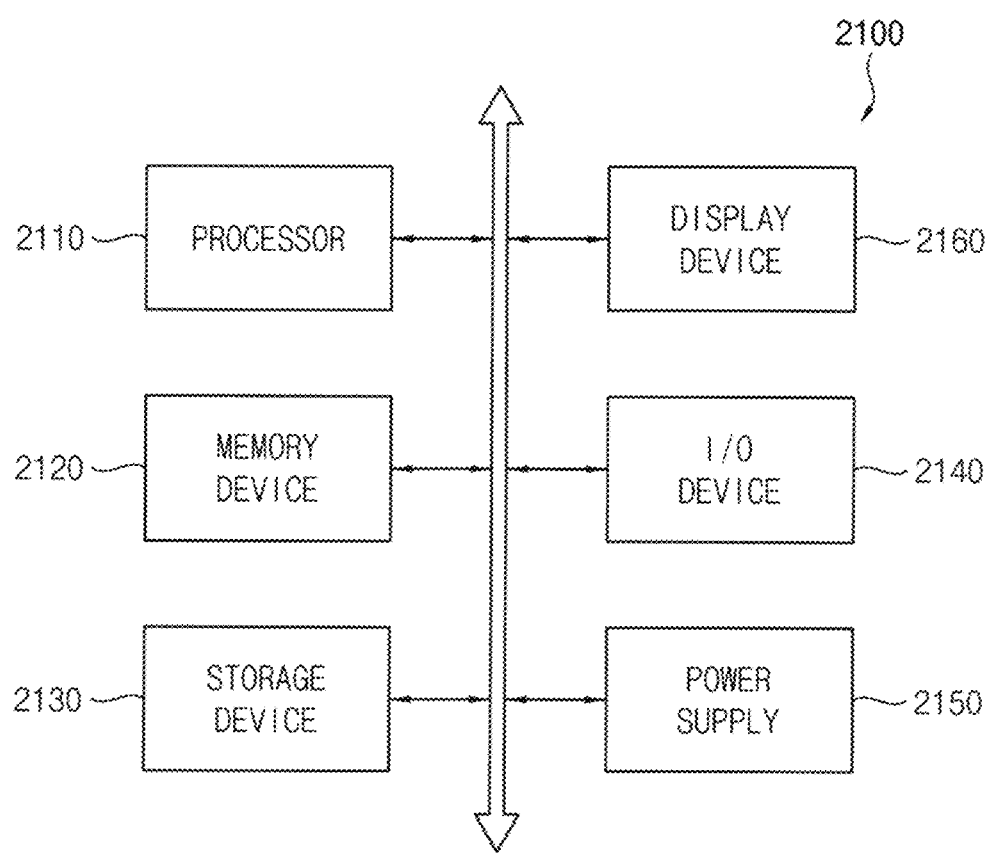
FIG. 16 is a block diagram illustrating an electronic device including a display device according to embodiments.

FIG. 16 is a block diagram illustrating an electronic device including a display device according to embodiments.

Referring to FIG. 16, an electronic device 2100 may include a processor 2110, a memory device 2120, a storage device 2130, an input/output device 2140, a power supply 2150, and a display device 2160.

The electronic device 2100 may further include several ports capable of communicating with a video card, a sound card, a memory card, a USB device, or other systems.

The processor 2110 may perform specific calculations or tasks. In an embodiment, the processor 2110 may be a microprocessor, a central processing unit ("CPU"), or the like. The processor 2110 may be connected to other components through an address bus, a control bus, and a data bus. In another embodiment, the processor 2110 may also be connected to an expansion bus such as a Peripheral Component Interconnect ("PCI") bus.

The memory device 2120 may store data necessary for the operation of the electronic device 2100. For example, the memory device 2120 may include non-volatile memory devices such as an Erasable Programmable Read-Only Memory ("EPROM"), an Electrically Erasable Programmable Read-Only Memory ("EEPROM"), a Flash Memory, a Phase Change Random Access Memory ("PRAM"), a Resistance Random Access Memory ("RRAM"), a Nano Floating Gate Memory ("NFGM"), a Polymer Random Access Memory ("PoRAM"), a Magnetic Random Access Memory ("MRAM"), and a Ferroelectric Random Access Memory ("FRAM") and/or a volatile memory devices such as a Dynamic Random Access Memory ("DRAM") a Static Random Access Memory ("SRAM"), mobile DRAM, or the like.

The storage device 2130 may include a solid state drive ("SSD"), a hard disk drive ("HDD"), a CD-ROM, or the like. The input/output device 2140 may include an input means such as a keyboard, a keypad, a touch pad, a touch screen, and a mouse, and an output means such as a speaker or a printer. The power supply 2150 may supply power required for the operation of the electronic device 2100. The display device 2160 may be connected to other components through the buses or other communication links.

The electronic device 2100 may include a mobile phone, a smart phone, a tablet computer, a digital TV, a 3D TV, a personal computer ("PC"), a home electronic device, a laptop computer, a Personal Digital Assistant ("PDA"), a Portable Multimedia Player ("PMP"), a digital camera, a music player, a portable game console, navigation, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a pad region; and
a plurality of pads disposed on the pad region,
wherein a first pad of the plurality of pads comprises:
   a first conductive pattern disposed on the pad region of the substrate and having a quadrangle shape in a plan view;
   an insulating layer disposed on the substrate and covering the first conductive pattern; and
   a second conductive pattern disposed on the insulating layer and contacting the first conductive pattern through a plurality of contact holes defined in the insulating layer,
wherein the quadrangle shape includes a first side extending in a first direction and a second side extending in a second direction perpendicular to the first direction,
wherein, in the first pad, the plurality of the contact holes are arranged along a diagonal direction of the quadrangle shape in the plan view, and
wherein, in the first pad, along at least one of the first direction and the second direction, each of the plurality of contact holes does not overlap any contact hole of the first pad.

2. The display device of claim 1,
wherein the diagonal direction is between the first direction and the second direction.

3. The display device of claim 2, wherein a length of the first side is less than a length of the second side.

4. The display device of claim 2, wherein a length of the first side is at least three times greater than a length of each of the contact holes in the first direction.

5. The display device of claim 1, wherein the insulating layer comprises:
an overlapping portion surrounding each of the contact holes and overlapping the first conductive pattern in the plan view; and
a non-overlapping portion surrounding the overlapping portion and which does not overlap the first conductive pattern in the plan view, and having a top which is disposed lower than a top of the overlapping portion.

6. The display device of claim 5, wherein a thickness of the overlapping portion is the same as a thickness of the non-overlapping portion.

7. The display device of claim 5, wherein each of a thickness of the overlapping portion and a thickness of the non-overlapping portion is about 6000 angstroms to about 7000 angstroms.

8. The display device of claim 1, further comprising:
a third conductive pattern disposed on the second conductive pattern and directly contacting the second conductive pattern.

9. The display device of claim 8, further comprising:
a fourth conductive pattern disposed on the third conductive pattern and directly contacting the third conductive pattern.

10. The display device of claim 1, further comprising:
a first dummy pattern disposed on the substrate, overlapping the pad region, and spaced apart from the first conductive pattern in the plan view; and
a second dummy pattern disposed on the first dummy pattern and contacting the first dummy pattern through a dummy contact hole defined in the insulating layer.

11. The display device of claim 10, wherein an area of the dummy contact hole is different from an area of each of the plurality of the contact holes in the plan view.

12. The display device of claim 10, wherein the pad region includes a central region and an outer region adjacent to the central region in the plan view,
wherein the first conductive pattern is disposed in the central region, and
wherein the first dummy pattern is disposed in the outer region.

13. A display device comprising:
a substrate including a pad region;
a first conductive pattern disposed on the pad region of the substrate and having a quadrangle shape in a plan view;
an insulating layer disposed on the substrate and covering the first conductive pattern; and
a second conductive pattern disposed on the insulating layer and contacting the first conductive pattern through a plurality of contact holes defined in the insulating layer,
wherein the plurality of the contact holes are arranged along a diagonal direction of the quadrangle shape in the plan view, and
wherein a material included in the second conductive pattern is the same as a material included in the third conductive pattern.

14. The display device of claim 13, wherein the material included in the second conductive pattern is different from a material included in the first conductive pattern.

15. The display device of claim 14, wherein the first conductive pattern includes molybdenum.

16. A display device comprising:
a substrate including a pad region;
a first conductive pattern disposed on the pad region of the substrate and having a quadrangle shape in a plan view;
an insulating layer disposed on the substrate and covering the first conductive pattern; and
a second conductive pattern disposed on the insulating layer and contacting the first conductive pattern through a plurality of contact holes defined in the insulating layer,
wherein the plurality of the contact holes are arranged along a diagonal direction of the quadrangle shape in the plan view, and
wherein the second conductive pattern and the third conductive pattern each have a Ti/Al/Ti structure.

17. A display device comprising:
a substrate including a pad region;
a first conductive pattern disposed on the pad region of the substrate and having a quadrangle shape in a plan view;
an insulating layer disposed on the substrate and covering the first conductive pattern; and
a second conductive pattern disposed on the insulating layer and contacting the first conductive pattern through a plurality of contact holes defined in the insulating layer,
wherein the plurality of the contact holes are arranged along a diagonal direction of the quadrangle shape in the plan view,
wherein the substrate further comprises a display region adjacent to the pad region, and
wherein the display device further comprises:
an active pattern disposed on the substrate and overlapping the display region in the plan view;
a gate electrode disposed in a same layer as the first conductive pattern and overlapping the active pattern in the plan view;
a first connection electrode disposed in a same layer as the second conductive pattern and contacting the active pattern;
a second connection electrode disposed in a same layer as the third conductive pattern and contacting the first connection electrode;
a first electrode disposed on the second connection electrode and contacting the second connection electrode;
an emission layer disposed on the first electrode; and
a second electrode disposed on the emission layer.

18. A display device comprising:
a substrate including a pad region;
a first conductive pattern disposed on the pad region of the substrate and having a quadrangle shape in a plan view;
an insulating layer disposed on the substrate and covering the first conductive pattern; and
a second conductive pattern disposed on the insulating layer and contacting the first conductive pattern through a plurality of contact holes defined in the insulating layer,
wherein the plurality of the contact holes are arranged along a diagonal direction of the quadrangle shape in the plan view,
wherein the display device further comprises:
a first dummy pattern disposed on the substrate, overlapping the pad region, and spaced apart from the first conductive pattern in the plan view;

a second dummy pattern disposed on the first dummy pattern and contacting the first dummy pattern through a dummy contact hole defined in the insulating layer, wherein an area of the dummy contact hole is different from an area of each of the plurality of the contact holes in the plan view, and wherein the area of the dummy contact hole is larger than the area of each of the plurality of the contact holes.

19. A display device comprising:
a substrate including a pad region;
a first conductive pattern disposed on the pad region of the substrate and having a quadrangle shape in a plan view;
an insulating layer disposed on the substrate and covering the first conductive pattern; and
a second conductive pattern disposed on the insulating layer and contacting the first conductive pattern through a plurality of contact holes defined in the insulating layer,
wherein the plurality of the contact holes are arranged along a diagonal direction of the quadrangle shape in the plan view,
wherein the display device further comprises:
  a first dummy pattern disposed on the substrate, overlapping the pad region, and spaced apart from the first conductive pattern in the plan view;
  a second dummy pattern disposed on the first dummy pattern and contacting the first dummy pattern through a dummy contact hole defined in the insulating layer, and
wherein the first dummy pattern and the second dummy pattern each are electrically floated.

20. A display device comprising:
a substrate including a pad region; and
a plurality of pads disposed on the pad region,
wherein a first pad of the plurality of pads comprises:
  a first conductive pattern disposed on the pad region of the substrate and having a quadrangle shape in a plan view;
  an insulating layer disposed on the substrate and covering the first conductive pattern; and
  a second conductive pattern disposed on the insulating layer and contacting the first conductive pattern through a plurality of contact holes defined in the insulating layer,
wherein the plurality of the contact holes includes a first contact hole, a second contact hole, and a third contact hole which are spaced apart from each other, wherein the first contact hole and the second contact hole are arranged along a first diagonal direction of the quadrangle shape, and wherein the second contact hole and the third contact hole are arranged along a second diagonal direction intersecting the first diagonal direction, wherein the quadrangle shape includes a first side extending in a first direction and a second side extending in a second direction perpendicular to the first direction, and wherein, in the first pad, along the first direction, each of the first contact hole, the second contact hole, and the third contact hole does not overlap any contact hole of the first pad.

21. The display device of claim 20,
wherein the first diagonal direction is a direction between the first direction and the second direction, and
wherein the second diagonal direction is a direction between a third direction and the second direction, and the third direction is opposite to the first direction.

22. A display device comprising:
a substrate including a pad region;
a first conductive pattern on the pad region of the substrate;
a first dummy pattern disposed in a same layer as the first conductive pattern and spaced apart from the first conductive pattern;
an insulating layer disposed on the substrate and covering the first conductive pattern and the first dummy pattern;
a second conductive pattern disposed on the insulating layer and contacting the first conductive pattern through a plurality of contact holes defined in the insulating layer; and
a second dummy pattern disposed on the insulating layer and contacting the first dummy pattern through a dummy contact hole, wherein the dummy contact hole is defined in the insulating layer and has an area different from an area of each of the plurality of the contact holes,
wherein the area of the dummy contact hole is larger than the area of each of the plurality of the contact holes.

23. The display device of claim 22, wherein the first conductive pattern has a quadrangle shape, and
wherein the plurality of the contact holes are arranged along a diagonal direction of the quadrangle shape in a plan view.

* * * * *